(12) United States Patent
Shim et al.

(10) Patent No.: US 9,671,969 B2
(45) Date of Patent: Jun. 6, 2017

(54) DATA STORAGE HAVING RECOVERY FUNCTION FOR THRESHOLD VOLTAGE DISTRIBUTION CHANGE OF MEMORY CELLS DUE TO APPLYING SURFACE MOUNTING TECHNOLOGY AND OPERATING METHOD

(71) Applicant: Samsung Electronics Co., Ltd., Suwon-si, Gyeonggi-do (KR)

(72) Inventors: In Bo Shim, Osan-si (KR); Jae-Sang Yun, Suwon-si (KR); Doo-Jin Yi, Seoul (KR); Young Joon Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/205,578

(22) Filed: Jul. 8, 2016

(65) Prior Publication Data

US 2017/0060463 A1    Mar. 2, 2017

(30) Foreign Application Priority Data

Aug. 24, 2015 (KR) ........................ 10-2015-0118993

(51) Int. Cl.
| | | |
|---|---|---|
| *G11C 16/06* | (2006.01) | |
| *G06F 3/06* | (2006.01) | |
| *G11C 16/04* | (2006.01) | |
| *G11C 16/10* | (2006.01) | |
| *G11C 16/34* | (2006.01) | |
| *G11C 16/20* | (2006.01) | |

(52) U.S. Cl.
CPC .......... *G06F 3/0625* (2013.01); *G06F 3/0655* (2013.01); *G06F 3/0688* (2013.01); *G11C 16/0466* (2013.01); *G11C 16/0483* (2013.01); *G11C 16/10* (2013.01); *G11C 16/20* (2013.01); *G11C 16/3454* (2013.01); *G11C 16/3459* (2013.01)

(58) Field of Classification Search
CPC . G11C 16/10; G11C 16/3459; G11C 16/3454; G11C 16/0466; G11C 16/20; G06F 3/0625; G06F 3/0655; G06F 3/0688
USPC ............. 365/185.22, 185.24, 185.18, 185.03
See application file for complete search history.

(56) References Cited

U.S. PATENT DOCUMENTS

| | | | |
|---|---|---|---|
| 7,606,076 B2 | 10/2009 | Ngyuen et al. | |
| 7,679,133 B2 | 3/2010 | Son et al. | |
| 8,351,276 B2 | 1/2013 | Choy et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,717,823 B2 * | 5/2014 | Kim .................. | G11C 11/5628 365/185.03 |
| 8,929,140 B2 | 1/2015 | Nagashima | |

(Continued)

FOREIGN PATENT DOCUMENTS

| | | |
|---|---|---|
| KR | 10-0861378 | 9/2008 |
| KR | 10-0861648 | 9/2008 |
| KR | 10-2014-0073817 | 6/2014 |

*Primary Examiner* — David Lam
(74) *Attorney, Agent, or Firm* — Myers Bigel, P.A.

(57) ABSTRACT

Methods of programming firmware in a data storage device include pre-programming memory cells included in at least one nonvolatile memory of a plurality of nonvolatile memories using a first verification voltage higher than a first reference voltage before a surface mounting technology is applied to the nonvolatile memories.

20 Claims, 18 Drawing Sheets

(56) References Cited

U.S. PATENT DOCUMENTS

| | | |
|---|---|---|
| 2011/0233648 A1 | 9/2011 | Seol et al. |
| 2014/0204694 A1 | 7/2014 | Choy |
| 2014/0229131 A1 | 8/2014 | Cohen et al. |
| 2014/0250155 A1 | 9/2014 | Chen et al. |
| 2015/0043281 A1 | 2/2015 | Hemink et al. |

* cited by examiner

|  | 1st Bit | 2nd Bit |
|---|---|---|
| Initial State | 0 | 0 |
| Pre-pgm | 1 | 0 |
| SMT | 1 | 0 |
| Re-pgm | 1 | 1 |

FIG. 15
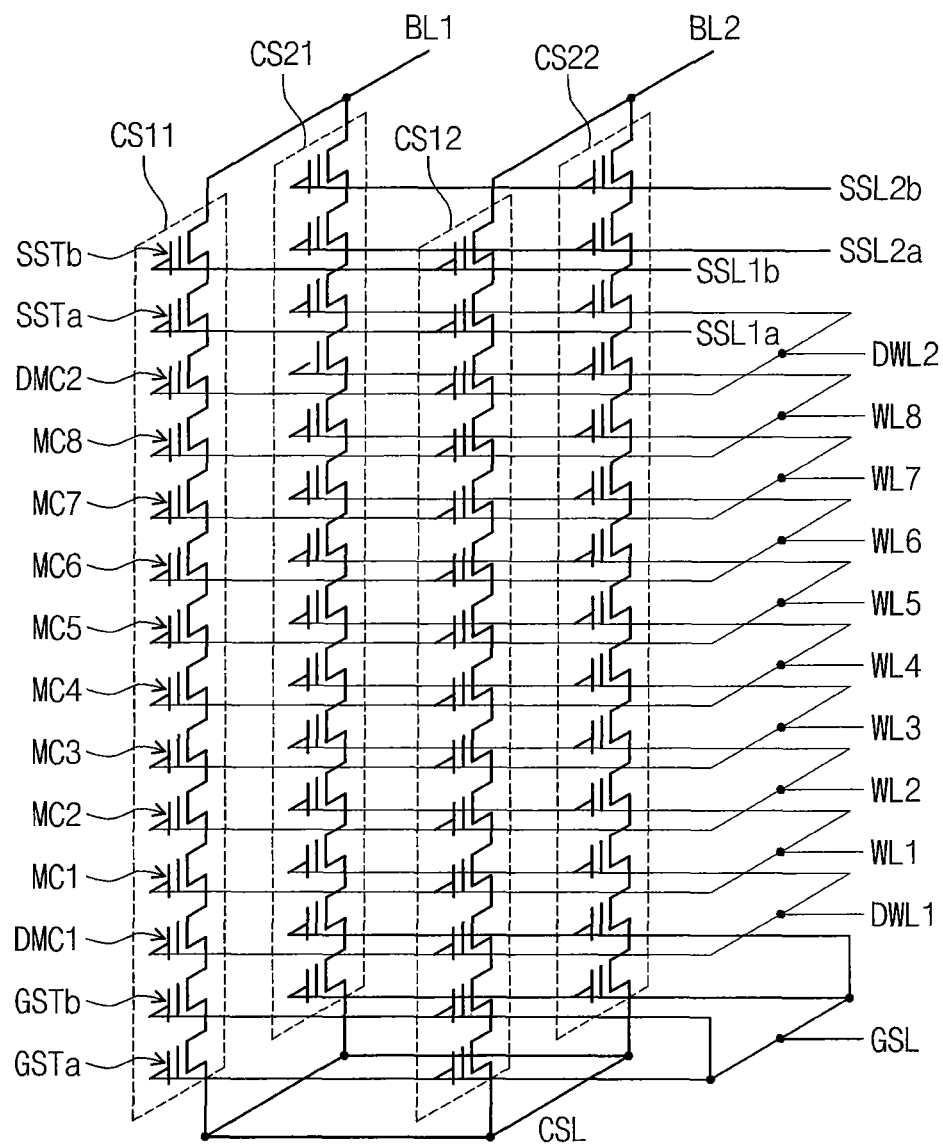
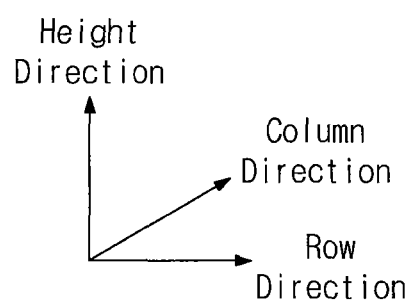

DATA STORAGE HAVING RECOVERY FUNCTION FOR THRESHOLD VOLTAGE DISTRIBUTION CHANGE OF MEMORY CELLS DUE TO APPLYING SURFACE MOUNTING TECHNOLOGY AND OPERATING METHOD

CROSS-REFERENCE TO RELATED APPLICATIONS

A claim for priority under 35 U.S.C. §119 is made to Korean Patent Application No. 10-2015-0118993 filed Aug. 24, 2015, in the Korean Intellectual Property Office, the entire contents of which are hereby incorporated by reference herein.

BACKGROUND

The inventive concepts described herein relate semiconductor devices, and more particularly, to data storage devices.

Semiconductor memory devices can include volatile semiconductor memory devices and nonvolatile semiconductor memory devices. A read speed and a write speed of the volatile semiconductor memory device may be relatively fast, but when a power supply is interrupted, data stored in a volatile semiconductor memory device is not retained. On the other hand, even though a power supply is interrupted, data stored in a nonvolatile semiconductor memory device is retained. Therefore, the contents stored in nonvolatile semiconductor memory devices can be preserved regardless of whether power is supplied.

Examples of data storage devices using nonvolatile memory devices include a solid state drive (SSD), an embedded Multi Media Card (eMMC), and the like. General data storage devices may be manufactured in finished form and shipped by a memory vendor after firmware is programmed.

However, a memory vendor may produce a controller, a nonvolatile memory, and the like and may deliver the products to a fabricator. The fabricator may mount a controller, a nonvolatile memory, and the like on on-board type data storage. The on-board type data storage may be delivered with firmware programmed.

However, since nonvolatile memory may be mounted on a board by surface mounting technology (SMT) at a relatively high temperature in the on-board type data storage, a threshold voltage distribution of memory cells may be changed. This may cause an uncorrectable error or a boot fail.

SUMMARY

Embodiments of the inventive concepts provide methods of pre-programming a nonvolatile memory before applying a surface mounting technology, which may reduce or prevent a boot fail.

According to some embodiments of the inventive concepts, a method of programming a data storage device includes performing operations by a controller before mounting a nonvolatile memory of the data storage device to a board. The operations include receiving a pre-program request for memory cells of the nonvolatile memory, and pre-programming the memory cells of the nonvolatile memory to alter respective threshold voltages thereof to a verification voltage that is greater than a reference voltage, responsive to the pre-program request. The verification voltage is based on an expected change in threshold voltage distribution of the memory cells due to an application of heat to the nonvolatile memory during the mounting. The memory cells of the nonvolatile memory include computer readable program code to control the data storage device stored therein.

In some embodiments, after the mounting of the nonvolatile memory to the board, the operations performed by the controller may further include re-programming the memory cells of the nonvolatile memory to alter the respective threshold voltages thereof to a voltage greater than or equal to the reference voltage.

In some embodiments, the respective threshold voltages may be reduced below the reference voltage responsive to the application of the heat during the mounting. The re-programming may include verifying operation of the memory cells after the mounting of the nonvolatile memory to the board, and selectively re-programming the memory cells of the nonvolatile memory responsive to the verifying.

In some embodiments, the nonvolatile memory may be a first nonvolatile memory of the data storage device. Responsive to failure of a verification operation for memory cells of a second nonvolatile memory of the data storage device after mounting the second nonvolatile memory to the board, the operations performed by the controller may further include copying the computer readable program code stored in the memory cells of the first nonvolatile memory to the memory cells of the second nonvolatile memory.

In some embodiments, the verification voltage may be a first verification voltage and the reference voltage may be a first reference voltage. The pre-programming may further include pre-programming the memory cells of the second nonvolatile memory to alter respective threshold voltages thereof to a second verification voltage that is greater than a second reference voltage and is different than the first verification voltage. Responsive to the failure of the verification operation for the memory cells of the second nonvolatile memory, the re-programming may further include re-programming the memory cells of the second nonvolatile memory to a voltage greater than or equal to the first reference voltage.

According to some embodiments of the inventive concepts, a method of programming firmware to a data storage including a plurality of nonvolatile memories and a controller configured to control the nonvolatile memories may include pre-programming first memory cells included in a first nonvolatile memory of the nonvolatile memories so as to have a level of a threshold voltage greater than or equal to a level of a first verification voltage which is higher than a level of a first reference voltage before a surface mounting technology is applied to the nonvolatile memories and pre-programming second memory cells included in a second nonvolatile memory of the nonvolatile memories so as to have a level of a threshold voltage greater than or equal to a level of a second verification voltage which is higher than a level of a second reference voltage. The level of the second reference voltage may be higher than the level of the first reference voltage.

The method may further include verifying whether the first memory cells are program-passed or not using the first reference voltage after the surface mounting technology is applied and verifying whether the second memory cells are program-passed or not using the second reference voltage.

Verifying the first memory cells may be performed before verifying the second memory cells. Alternatively, the method may further include re-programming the first memory cells so as to have a threshold voltage greater than or equal to the first reference voltage if the first memory cells are program-passed.

Re-programming the first memory cells may be performed with respect to memory cells, of which threshold voltages are lower than the first reference voltage, from among the first memory cells. Re-programming the first memory cells may be performed using a power-on reset as a trigger condition. The method may further include programming the firmware, which is re-programmed on the first memory cells, at the second memory cells. The second memory cells may be programmed to have a threshold voltage greater than or equal to the first reference voltage.

The method may further include determining whether a nonvolatile memory to be verified exists if the first memory cells are program-failed. The method may further include verifying whether the second memory cells are program-passed or not if the nonvolatile memory to be verified exists. The method may further include re-programming the second memory cells so as to have a threshold voltage greater than or equal to the second reference voltage if the second memory cells are program-passed. The method may further include programming the firmware, which is re-programmed on the second memory cells, on the first memory cells. The first memory cells may be programmed to have a threshold voltage greater than or equal to the second reference voltage.

The levels of the first and second reference voltages and the levels of the first and second verification voltages may be set in view of a change in a threshold voltage distribution according to application of the surface mounting technology.

The data storage may be an on-board type storage which the nonvolatile memories and the controller are mounted on a board.

Each of the nonvolatile memories may include a plurality of cell strings connected to a bit line, each of the cell strings may include a plurality of memory cells serially connected to each other, and the memory cells may be connected to a plurality of word lines, respectively.

According to another embodiment of the inventive concepts, a method of programming firmware to a data storage including a plurality of nonvolatile memories and a controller configured to control the nonvolatile memories may include pre-programming memory cells included in at least one nonvolatile memory of the nonvolatile memories so as to have a threshold voltage greater than or equal to a verification voltage which is higher than a reference voltage before a surface mounting technology is applied to the nonvolatile memories. The reference voltage and the verification voltage may be set in view of a change in a threshold voltage distribution according to an application of the surface mounting technology.

The method may further include re-programming the pre-programmed memory cells so as to have a threshold voltage greater than or equal to the reference voltage after the surface mounting technology is applied.

Re-programming the pre-programmed memory cells may be performed with respect to a memory cell, of which a threshold voltage is lower than the reference voltage, from among the memory cells. Alternatively, re-programming the pre-programmed memory cells may be performed using a power-on reset as a trigger condition. Alternatively, the method may further include verifying whether the pre-programmed memory cells are program-passed or not, using the reference voltage, before re-programming the pre-programmed memory cells is performed.

The data storage may be an on-board type storage which the nonvolatile memories and the controller are mounted on a board.

According to some embodiments of the inventive concepts, a semiconductor package may include a controller configured to pre-program first memory cells included in a first nonvolatile memory of the nonvolatile memories so as to have a level of a threshold voltage greater than or equal to a level of a first verification voltage which is higher than a level of a first reference voltage before a surface mounting technology is applied to the nonvolatile memories to program firmware and pre-programs second memory cells included in a second nonvolatile memory of the nonvolatile memories so as to have a level of a threshold voltage greater than or equal to a level of a second verification voltage which is higher than a level of a second reference voltage.

The level of the second reference voltage is higher than the level of the first reference voltage. Alternatively, before the surface mounting technology is applied, the controller may verify whether the first memory cells are program-passed or not using the first reference voltage and may verify whether the second memory cells are program-passed or not using the second reference voltage.

The controller may perform a verification operation about or with respect to the first memory cells before a verification operation about or with respect to the second memory cells. Alternatively, if the first memory cells are program-passed, the controller may re-program the first memory cells using the first reference voltage.

The controller may re-program memory cells, of which threshold voltages are lower than the first reference voltage, from among the first memory cells. Alternatively, the controller may program the firmware, which is re-programmed to the first memory cells, to the second memory cells and may program the second memory cells such that the second memory cells have a threshold voltage greater than or equal to the first reference voltage.

If the first memory cells are program-failed, the controller may determine whether a nonvolatile memory to be verified exists. If the nonvolatile memory to be verified exists, the controller may verify whether the second memory cells are program-passed. If the second memory cells are program-passed, the controller may re-program the second memory cells so as to have a threshold voltage greater than or equal to the second reference voltage. Alternatively, the controller may program the firmware, which is re-programmed to the second memory cells, to the first memory cells and may program the first memory cells such that the first memory cells have a threshold voltage greater than or equal to the second reference voltage.

The semiconductor package may further include a buffer for temporarily storing the firmware. Alternatively, the levels of the first and second reference voltages and the levels of the first and second verification voltages may be set in view of a change in a threshold voltage distribution according to application of the surface mounting technology.

According to some embodiments of the inventive concepts, a data storage device may include a first semiconductor package including a plurality of nonvolatile memories and a second semiconductor package. Each of the nonvolatile memories comprises a plurality of cell strings connected to a bit line, and each of the cell strings comprises a plurality of memory cells serially connected to each other, and the memory cells are connected to a plurality of word lines, respectively. The second semiconductor package may include a controller configured to pre-program first memory cells included in a first nonvolatile memory of the nonvolatile memories so as to have a threshold voltage greater than or equal to a first verification voltage which is higher than a first reference voltage before a surface mounting technology is applied to the nonvolatile memories to program firmware and pre-programs second memory cells included in a second nonvolatile memory of the nonvolatile memories so as to have a threshold voltage greater than or equal to a second verification voltage which is higher than a second reference voltage.

The level of the second reference voltage is higher than the level of the first reference voltage. Alternatively, before the surface mounting technology is applied, the controller may verify whether the first memory cells are program-passed or not using the first reference voltage and may verify whether the second memory cells are program passed or not using the second reference voltage.

If the first memory cells are program-passed, the controller may re-program the first memory cells using the first reference voltage. The controller may program the firmware, which is re-programmed on the first memory cells, on the second memory cells and may program the second memory cells so as to have a threshold voltage greater than or equal to the first reference voltage.

The second semiconductor package may further include a buffer for temporarily storing the firmware. Alternatively, the data storage may be an on-board solid state drive in which the first semiconductor package and the second semiconductor package are mounted on a board.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 15 is a circuit diagram illustrating an example of one of the memory blocks included in a cell array of a memory cell array in FIG. 14;

DETAILED DESCRIPTION

Figure 1:
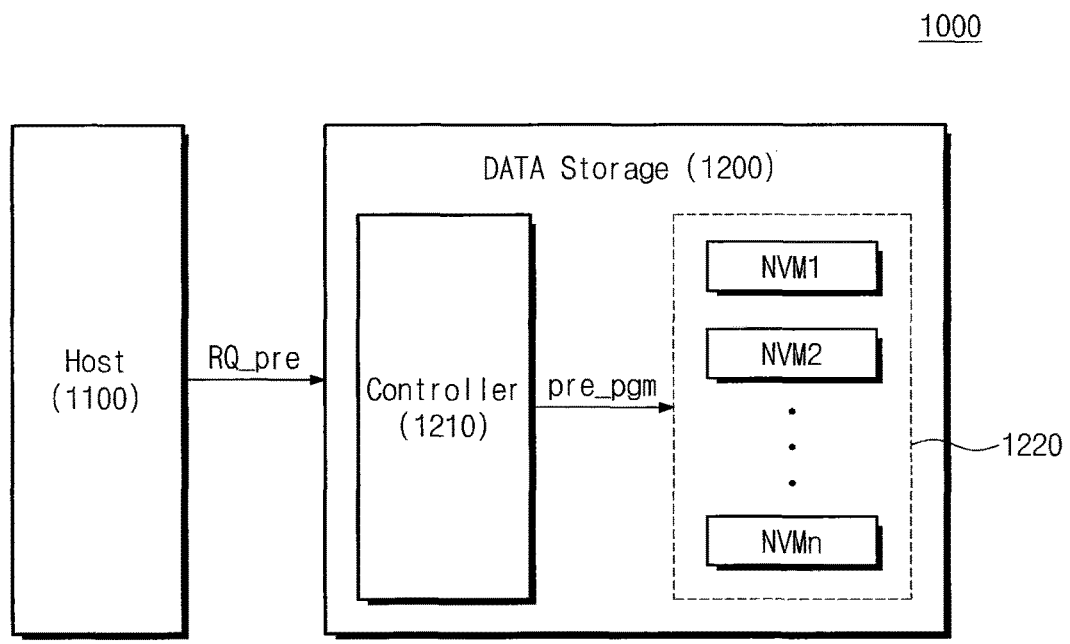
FIG. 1 is a block diagram illustrating a nonvolatile memory system 1000 according to some embodiments of the inventive concepts.

It is to be understood that both the foregoing general description and the following detailed description are provided as examples, for illustration and not for limiting the scope of the inventive concepts. Reference will now be made in detail to embodiments of the inventive concepts, examples of which are illustrated in the accompanying drawings. The same reference numbers are used in the drawings and the description to refer to the same or like parts.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. As used herein, the term "and/or," includes any and all combinations of one or more of the associated listed items.

Even though the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another element, component, region, layer, or section. Thus, a first element, component, region, layer, or section discussed below could be termed a second element, component, region, layer, or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The terminology used herein is for the purpose of describing particular embodiments only and is not intended to be limiting of example embodiments of the inventive concepts. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Below, embodiments of the inventive concepts will be described with reference to accompanying drawings in order to describe the embodiments of the inventive concepts in detail to the extent that one skilled in the art can implement the scope and spirit of the inventive concepts.

FIG. 1 is a block diagram illustrating a nonvolatile memory system 1000 according to some embodiments of the inventive concepts. Referring to FIG. 1, a nonvolatile memory system 1000 may include a host 1100 and data storage 1200. The data storage 1200 may include a controller 1210 and a plurality of nonvolatile memories 1220.

The host 1100 may store data in the data storage 1200. For example, the host 1100 may be test equipment for programming firmware or software at a portion of the nonvolatile memories 1220 after the controller 1210 and the nonvolatile memories 1220 are manufactured. Alternatively, the host 1100 may be a desktop computer, a laptop computer, or a mobile device in which the data storage 1200 or the controller 1210 and the nonvolatile memories 1220 are mounted by the surface mounting technology (SMT). The surface mounting technology is exemplified. However, the scope and spirit of the inventive concepts may not be limited thereto. For example, the surface mounting technology may be various mounting technologies in which heat is transmitted to the nonvolatile memories 1220 while the nonvolatile memories are mounted.

The data storage 1200 according to some embodiments of the inventive concepts may perform a pre-program operation in response to a pre-program request RQ_pre from the host 1100. For example, the pre-program operation may refer to programming memory cells such that a threshold voltage of the memory cells has a verification voltage greater than a reference voltage. For example, a level of the verification voltage greater than a level of the reference voltage may be set in view of an expected or predicted change in threshold voltage distribution according to application of the SMT process. For example, the pre-program operation may be performed with respect to a nonvolatile memory in which firmware or software (or other computer readable program code) for controlling the data storage 1200 is stored. Moreover, firmware or software for controlling the data storage 1200 may be stored in at least one nonvolatile memory of the nonvolatile memories 1220.

One memory cell of a nonvolatile memory in which firmware or software is stored may store data of 1 bit. However, the scope and spirit of the inventive concepts may not be limited thereto. For example, when user data is stored in a triple level cell (TLC), firmware or software may be stored in a single level cell (SLC) or a multi-level cell (MLC).

Figure 5:
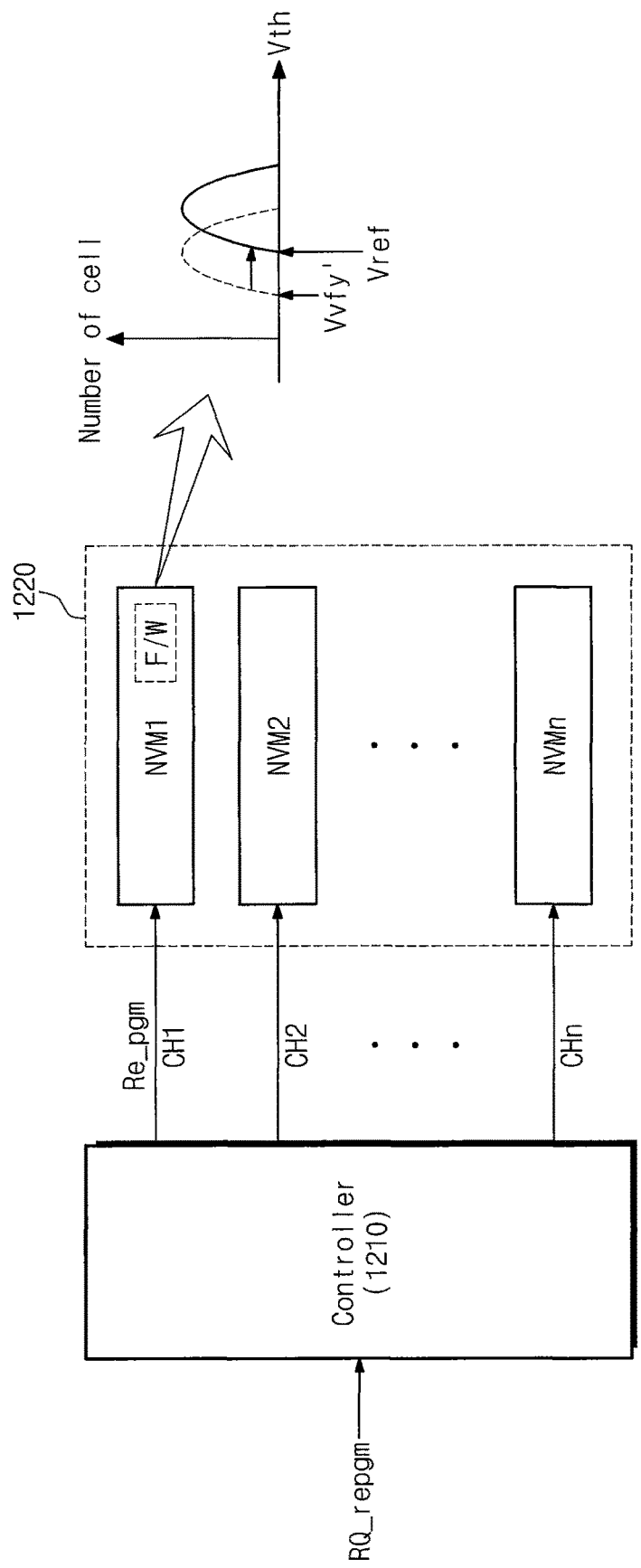
FIG. 5 illustrates re-programming memory cells to adjust a changed threshold voltage distribution after an SMT process according to some embodiments of the inventive concepts.

According to some embodiments of the inventive concepts, after the controller 1210 and the nonvolatile memories 1220 are manufactured and before mounted on a board (i.e., before a threshold voltage distribution is changed because a heat is applied to a nonvolatile memory), memory cells in each of the nonvolatile memories 1220 may be programmed using the verification voltage greater than the reference voltage. For example, when nonvolatile memories 1220 are mounted on a board using the SMT, or the like, a threshold voltage distribution of a memory cell may be changed, as illustrated in FIG. 5. Accordingly, an error or a boot fail may be reduced or prevented by programming firmware at memory cells using a voltage level greater than a threshold voltage which is predicted to be reduced.

Figure 2:
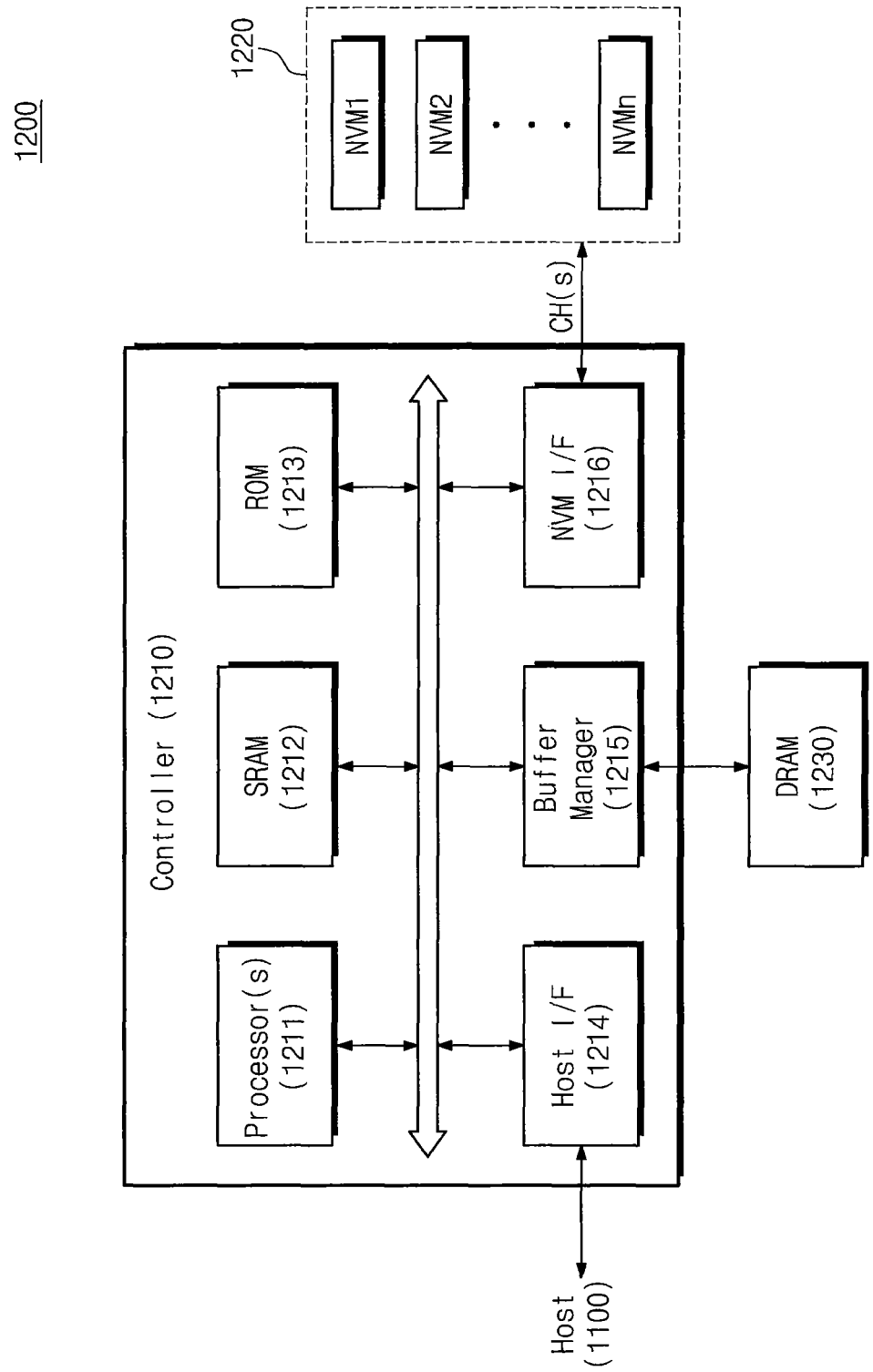
FIG. 2 is a block diagram illustrating data storage 1200 illustrated in FIG. 1.

FIG. 2 is a block diagram illustrating data storage 1200 illustrated in FIG. 1. Referring to FIG. 2, the data storage 1200 may include the controller 1210, the plurality of nonvolatile memories 1220, and a DRAM 1230. For example, the data storage 1200 may be on-board type of a solid state drive (SSD) which the controller 1210 and the nonvolatile memories 1220 are directly mounted on a board (e.g., printed circuit board). The controller 1210 may include a processor 1211, a static random access memory (SRAM) 1212, a read only memory (ROM) 1213, a host interface 1214, a buffer manager 1215, and a nonvolatile memory interface 1216.

The processor 1211 may perform an overall operation of the controller 1210. The processor 1211 may drive firmware for driving the controller 1210. The firmware may be loaded on the SRAM 1212 and may be driven, and the firmware may be a flash translation layer (FTL), or the like.

Software or firmware for controlling the controller 1210 may be loaded on the SRAM 1212. For example, the flash translation layer may be loaded on the SRAM 1212. Some embodiments of the inventive concepts are exemplified with reference to a controller 1210 that includes an SRAM. However, the scope and spirit of the inventive concepts may not be limited thereto. For example, a cache memory, a dynamic random access memory (DRAM), a phase-change RAM (PRAM), or a flash memory, or the like may be used instead of the SRAM 1212.

Various operations or firmware to operate the controller 1210 may be stored in the ROM 1213. For example, cord data for performing an interface with a flash translation layer or the host 1100 may be stored in the ROM 1213.

The host interface 1214 may provide an interface between the host 1100 and the controller 1210. The host 1100 and the controller 1210 may be connected through at least one of various standardized interfaces. The standardized interfaces may include various interfaces such as an advanced technology attachment (ATA), a serial ATA (SATA), an external SATA (e-SATA), a small computer small interface (SCSI), a serial attached SCSI (SAS), a peripheral component interconnection (PCI), a PCI express (PCI-E), a universal serial bus (USB), IEEE 1394, a card interface, and the like.

The buffer manager 1215 may provide an interface between the controller 1210 and the DRAM 1230. Data to be stored in the nonvolatile memories 1210 or data to be read from the nonvolatile memories 1220 may be temporarily stored in a buffer (e.g., DRAM 1230 illustrated in FIG. 2)

The nonvolatile memory interface 1216 may provide an interface between the controller 1210 and the nonvolatile memories 1220. For example, the controller 1210 may exchange data with the nonvolatile memories 1220 through the nonvolatile memory interface 1216.

The nonvolatile memories 1220 may include, for example, a 3-dimensional memory array. The 3-dimensional memory array may be monolithically formed in one or more physical level(s) of a memory cell array having an active area arranged on a circuit that is related based on a silicon substrate and/or based on an operation of memory cells. The circuit related based on an operation of memory cells may be located in a substrate or on a substrate. The term "monolithic" may refer to layers of each level of the array that are directly deposited or otherwise formed on the layers of each underlying level of the array.

In some embodiments of the inventive concepts, the 3D memory array includes vertical NAND strings that are vertically oriented such that at least one memory cell is located over another memory cell. The at least one memory cell may include a charge trap layer. Each of a vertical NAND string may include at least one selection transistor which is located on memory cells. At least one selection transistor may have the same structure as memory cells, and be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648. However, the nonvolatile memories 1220 may be, but are not limited to, a planar type of memory device. The nonvolatile memories 1220 may be connected to the nonvolatile memory interface 1216 through the channels CH(s).

The DRAM 1230 may temporarily store data to be stored to the nonvolatile memories 1220 or data to be read from the nonvolatile memories 1220. Some embodiments of the inventive concepts are exemplified as the data storage 1200 includes a DRAM. However, the scope and spirit of the inventive concepts may not be limited thereto. For example, an SRAM, a PRAM or various combinations thereof may be used.

Figure 3:
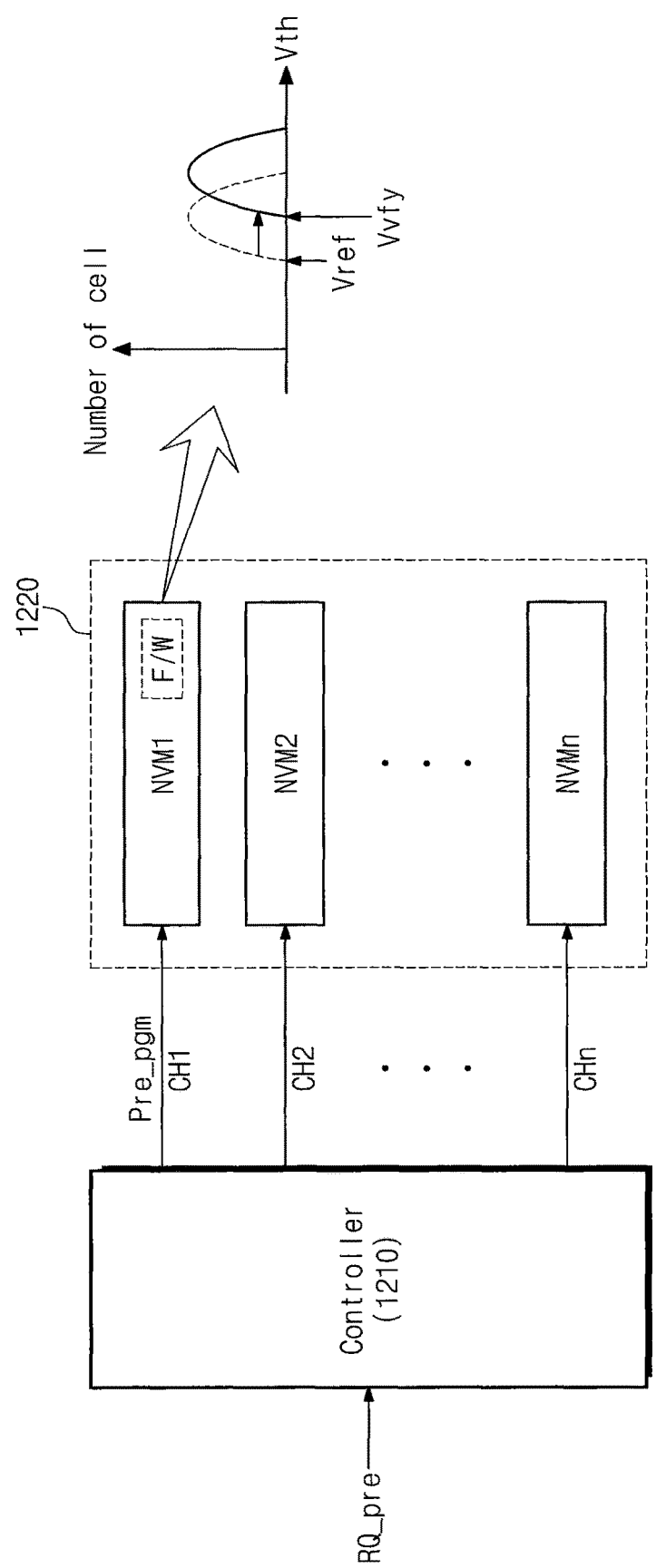
FIG. 3 illustrates an operation to pre-program memory cells so as to have a level of a threshold voltage greater than a level of a reference voltage according to some embodiments of the inventive concepts.
Figure 4:
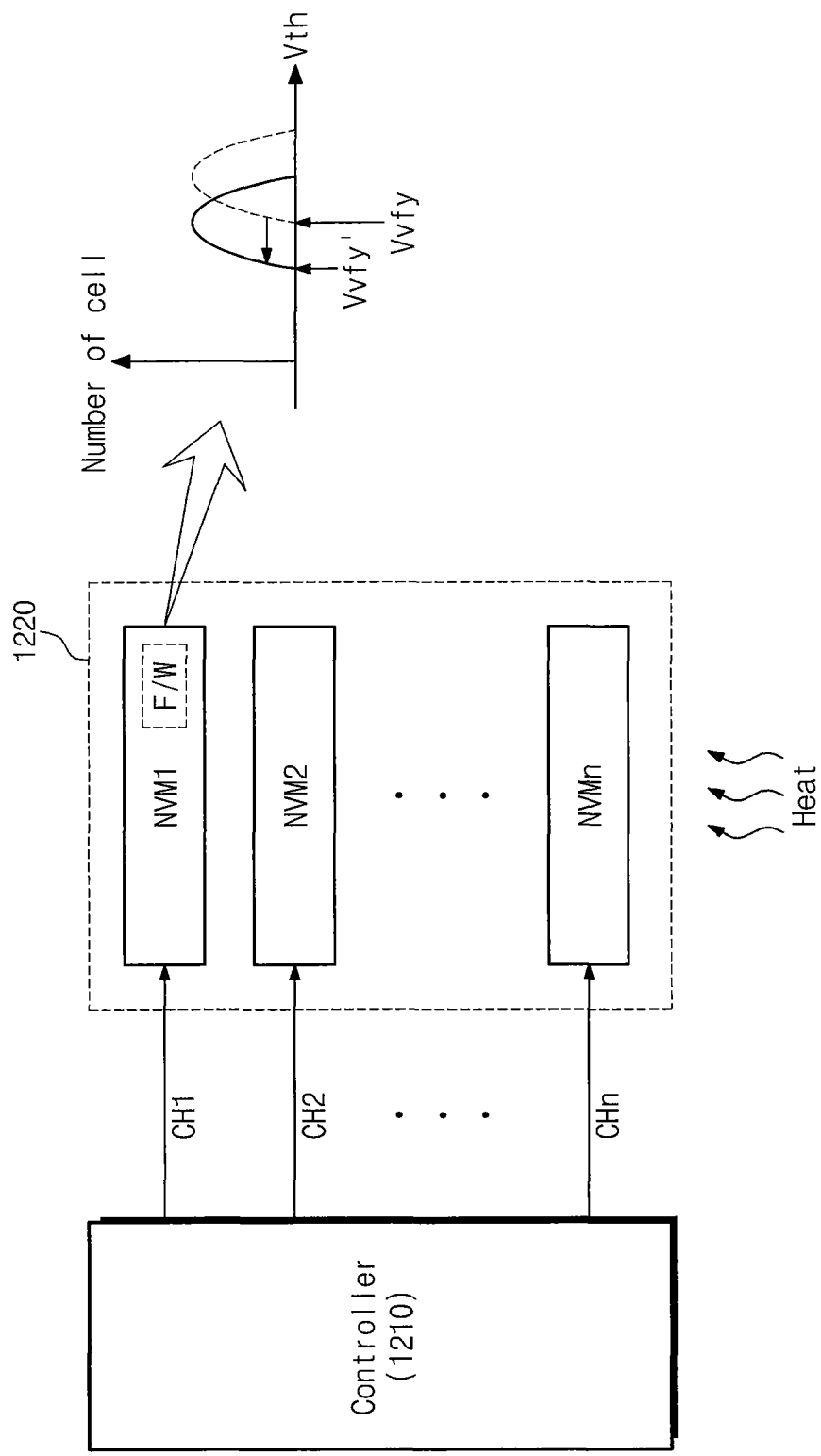
FIG. 4 illustrates that a threshold voltage distribution of the nonvolatile memory moves after an SMT process.

FIGS. 3 to 5 are block diagrams illustrating methods of operating data storage according to some embodiments of the inventive concepts. FIG. 3 illustrates an operation to pre-program memory cells using a level of a verification voltage greater than a level of a reference voltage. FIG. 4 illustrates that a threshold voltage distribution of the nonvolatile memory moves after an SMT process. FIG. 5 illustrates re-programming memory cells to adjust a changed threshold voltage distribution after an SMT process.

Referring to FIG. 3, the controller 1210 may receive a pre-program request RQ_pre from a host. The pre-program request RQ_pre may be a request about or with respect to at least one nonvolatile memory, at which firmware or software for driving the data storage 1200 is programmed, from among the nonvolatile memories 1220. The pre-program request RQ_pre may be a request to program memory cells using a verification voltage Vvfy greater than a reference voltage Vref. Moreover, when the pre-program request RQ_pre is received, firmware or software may be also received together.

When the pre-program request is received from the host, the controller 1210 may program the received firmware or the received software in at least one of the nonvolatile memories 1220. Some embodiments of the inventive concepts are exemplified as firmware F/W is programmed at one nonvolatile memory NVM1 illustrated in FIG. 3. However, the scope and spirit of the inventive concepts may not be limited thereto. For example, two or more nonvolatile memories may be programmed according to capacity of firmware or a firmware operating policy. The firmware operating policy in which two or more nonvolatile memories are used will be described in detail in FIG. 10. Memory cells of the nonvolatile memory NVM1 may be programmed so as to have the verification voltage Vvfy greater than the reference voltage Vref based on a pre-program operation.

Referring to FIG. 4, a heat may be applied to the nonvolatile memories 1220 due to an SMT process. Some embodiments of the inventive concepts are exemplified as an SMT process is applied to the nonvolatile memories 1220. However, the scope and spirit of the inventive concepts may not be limited thereto. For example, various processes, in which a heat is generated, such as an infrared ray reflow (IR reflow), and the like may be applied to the nonvolatile memories 1220. When a heat due to an SMT process is applied to the nonvolatile memories 1220, a threshold voltage distribution of the memory cells may be changed. For example, a voltage level (i.e., Vvfy') of a lower tail or end of the changed threshold voltage distribution may be smaller than a voltage level (i.e., Vvfy) of a lower tail or end of a threshold voltage distribution of the memory cells according to a pre-program operation described in FIG. 3.

According to some embodiments of the inventive concepts, even though a threshold voltage distribution is changed according to an SMT process when memory cells are programmed using a verification voltage (e.g., Vvfy) greater than the reference voltage Vref during a pre-program operation, it may be reduced or prevented that the threshold voltage distribution moves to an erase region. In other words, a boot fail may be reduced or prevented from occurring. Accordingly, reliability of data storage may be improved.

However, even though a pre-program operation is performed as a result of predicting a change of a threshold voltage distribution according to an SMT process, a level of a verification voltage about or with respect to the threshold voltage distribution changed due to the SMT process may be different from a level of the reference voltage Vref which is originally intended by a memory vendor. Accordingly, even though a threshold voltage distribution is changed after an SMT process, there may be a need to finely readjust a threshold voltage distribution. The description thereof will be described in detail with reference to FIG. 5.

FIG. 5 illustrates a re-program operation performed after a threshold voltage distribution is changed due to an SMT process. When a re-program request RQ_repgm is received from a host, the controller 1210 may perform a re-program operation Re_pgm with respect to the nonvolatile memory NVM1 at which firmware is programmed. After an SMT process, each of memory cells of the nonvolatile memory NVM1 may have a threshold voltage greater than or equal to Vvfy'. However, after the re-program operation, memory cells of the nonvolatile memory NVM1 may be re-programmed so as to have a threshold voltage greater than or equal to a reference voltage Vref.

Figures 6, 7:
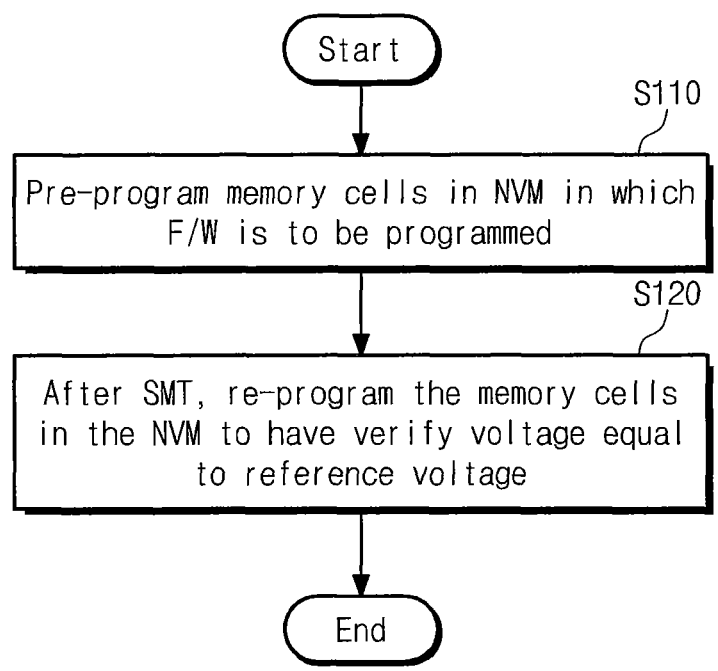
FIG. 6 is a table used to perform pre-program and re-program operations, according to some embodiments of the inventive concepts.
FIG. 7 is a flowchart illustrating an operating method of data storage according to some embodiments of the inventive concepts.

In FIG. 5, some embodiments of the inventive concepts are exemplified as a re-program operation is performed according to a request from the host. However, the scope and spirit of the inventive concepts may not be limited thereto. For example, the re-program operation may be performed when a specific trigger condition is satisfied. For example, after the controller 1210 and the nonvolatile memories 1220 are delivered by a memory vendor, the controller 1210 and the nonvolatile memories 1220 may be mounted on a board by a fabricator through an SMT process. Afterwards, the controller 1210 and the nonvolatile memories 1220 may be powered on and reset. When a power-on reset is detected, memory cells in the nonvolatile memory NVM1 at which firmware is programmed may be re-programmed. That is, reliability of data storage may be improved by precisely adjusting a threshold voltage distribution of the memory cells in the nonvolatile memory NVM1, at which firmware is programmed, through a re-program operation FIG. 6 is a table used to perform pre-program and re-program operations, according to some embodiments of the inventive concepts.

Since firmware or software for driving data storage may be stored in a portion of a plurality of nonvolatile memories, there may be a need to separately manage a nonvolatile memory in which pre-program and re-program operations are to be performed. A table management method will be described with reference to FIGS. 3 to 6. A table may be constructed with a plurality of bits. Some embodiments of the inventive concepts will be described under assumption that the table is constructed with 2 bits.

The table may be described with reference to two bits. An initial state of the table may be '00'. A first bit of the table may relate to the nonvolatile memory NVM1, in which a pre-program operation is performed, from among the nonvolatile memories 1220. A flag of a nonvolatile memory to be pre-programmed using firmware may be marked with '1'. A second bit of the table may relate to whether the pre-programmed nonvolatile memory NVM1 is re-programmed. When a nonvolatile memory is re-programmed according to a re-program request from a host or according to satisfaction of a specific trigger condition such as a power-on reset, a flag of a re-programmed nonvolatile memory may be marked with '1'.

For example, the table may be stored in a nonvolatile memory or in the SRAM 1212 illustrated in FIG. 2. It may be possible to effectively manage nonvolatile memories by managing information about whether to be pre-programmed or whether to be re-programmed using the table.

FIG. 7 is a flowchart illustrating methods of operating data storage according to some embodiments of the inventive concepts. The method of operating data storage will be described with reference to FIGS. 3 to 5 and 7.

In step S110, memory cells of a nonvolatile memory on which firmware is or is to be programmed may be pre-programmed. For example, the pre-program operation may refer to an operation to program memory cells using the verification voltage Vvfy greater than the reference voltage Vref. A voltage level (i.e., Vvfy) of a lower tail or end of a threshold voltage distribution of the pre-programmed memory cells may be set in view of an expected or predicted change in a threshold voltage distribution due to an SMT process.

In step S120, a re-program operation may be performed after an SMT process is performed with respect to the controller 1210 and the nonvolatile memories 1220. The re-program operation may refer to an operation to program the pre-programmed memory cells using the reference voltage Vref. For example, when a trigger condition such as a power-on reset is satisfied, the re-program operation may be performed.

Figure 8:
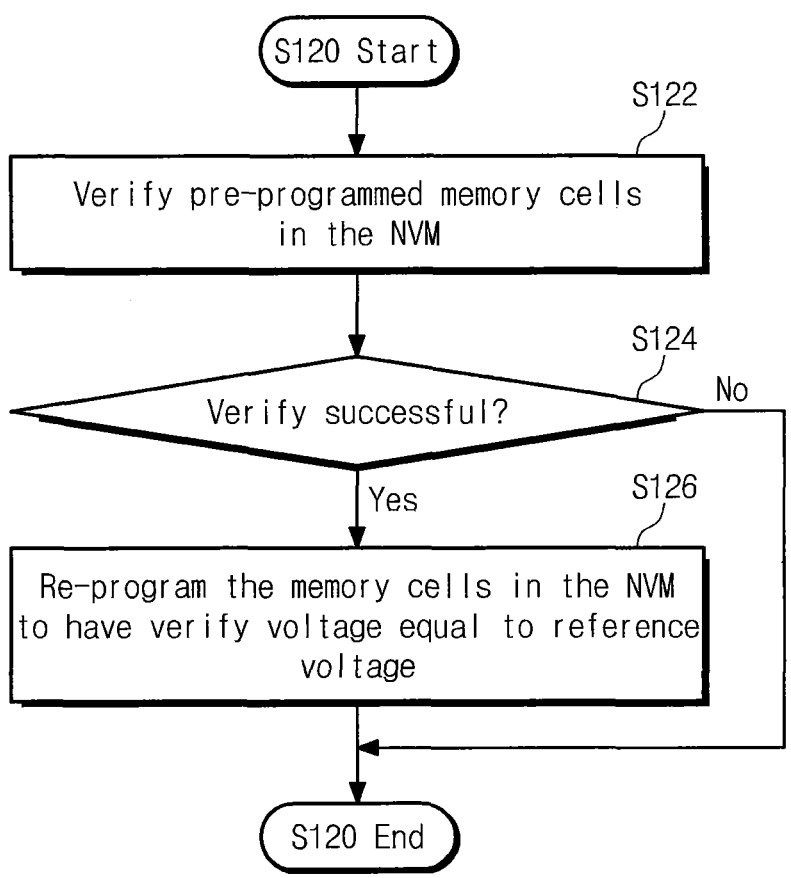
FIG. 8 is a flowchart illustrating step S120 illustrated in FIG. 7.

FIG. 8 is a flowchart illustrating step S120 illustrated in FIG. 7.

In step S122, a verification operation about or with respect to the pre-programmed memory cells may be performed. For example, the verification operation may be performed by changing a level of a verification voltage about or with respect to the pre-programmed memory cells and searching for a lower tail or end of a threshold voltage distribution.

In step S124, a determination as to whether a verification operation about or with respect to memory cells in the pre-programmed memory block is successful may be performed. If a program operation is passed (i.e., yes), the procedure may proceed to step S126. On the other hand, when a cell of which a threshold voltage is distributed in an erase region of a threshold voltage distribution diagram exists, or when a memory cell in which a read fail occurs exists, this may indicate a program fail.

In step S126, memory cells in the pre-programmed memory block may be re-programmed using the reference voltage Vref.

Figure 9:
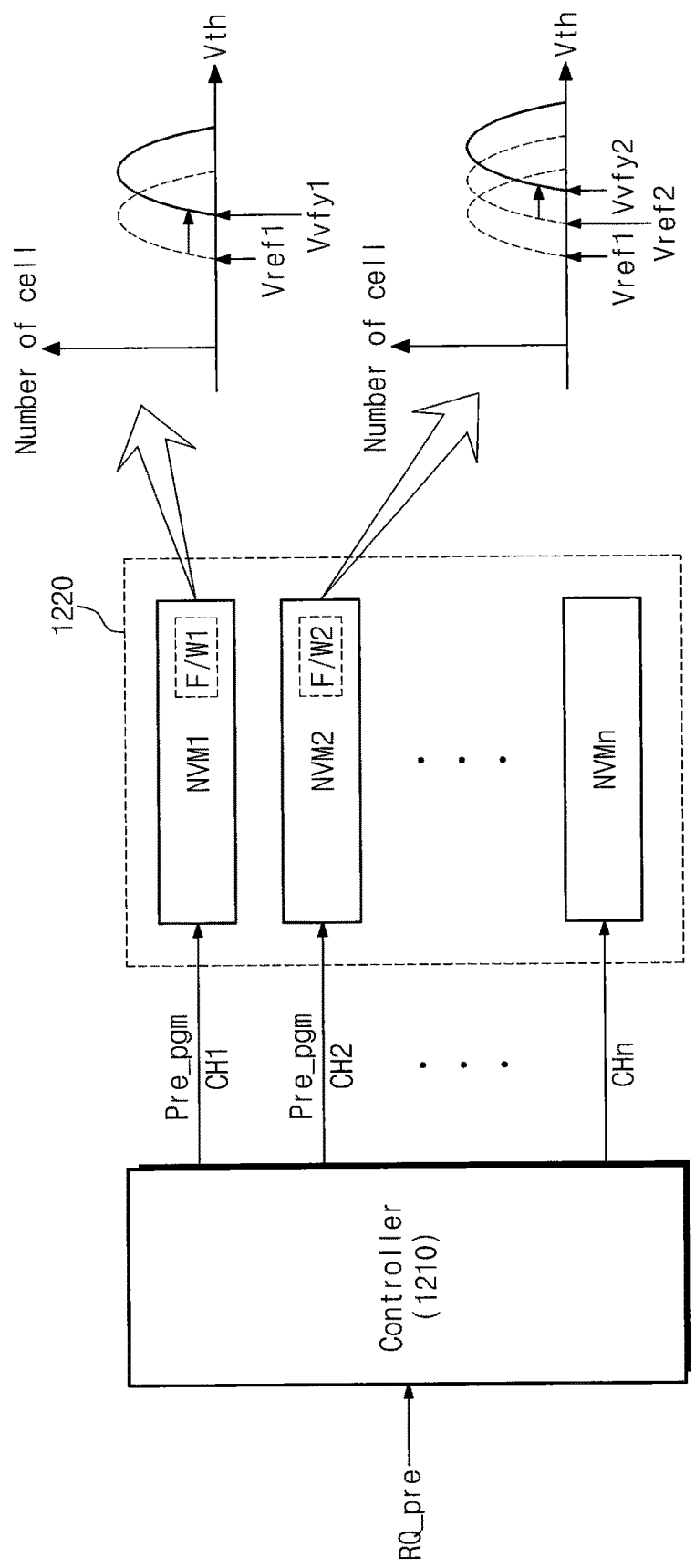
FIG. 9 is a schematic diagram for describing an operation to pre-program memory cells so as to have a level of a threshold voltage greater than a level of a reference voltage according to some embodiments of the inventive concepts.
Figure 10:
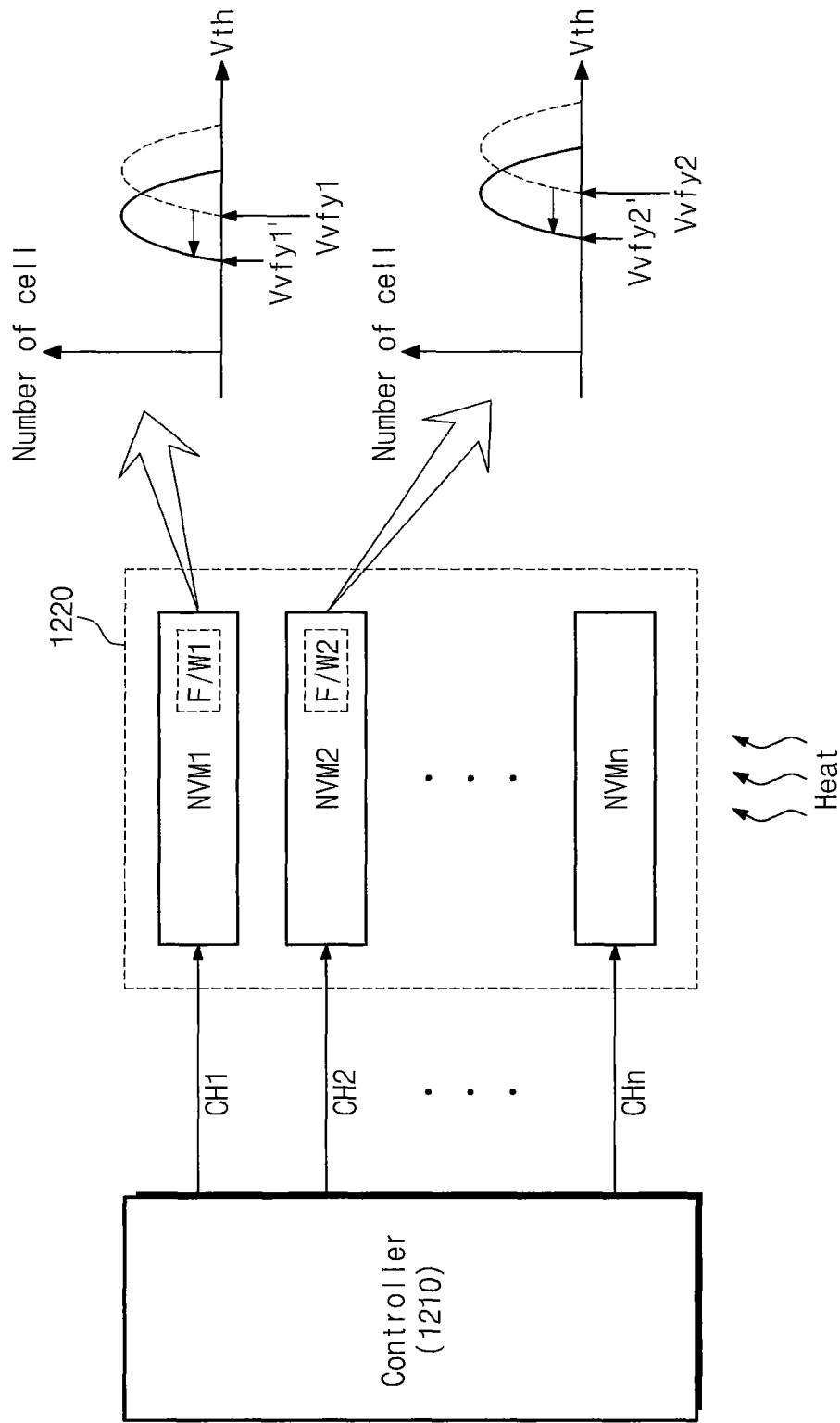
FIG. 10 is a schematic diagram for describing that a threshold voltage distribution of the nonvolatile memory moves after an SMT process.
Figure 11:
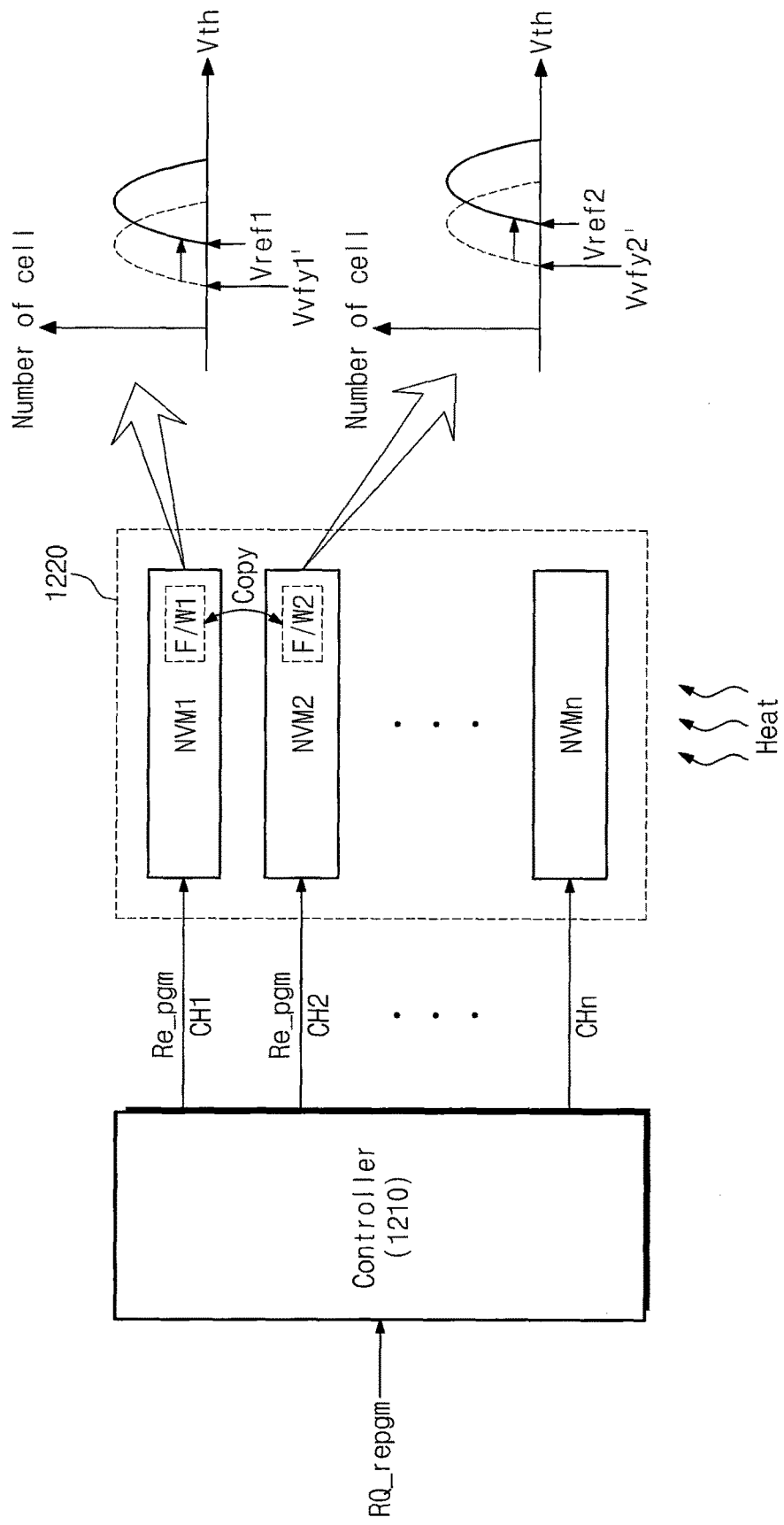
FIG. 11 is a block diagram for describing re-programming to adjust a changed threshold voltage distribution after an SMT process according to some embodiments of the inventive concepts.

FIGS. 9 to 11 are block diagrams for describing methods of operating data storage according to some embodiments of the inventive concepts. According to some embodiments of the inventive concepts, methods of pre-programming or re-programming the same firmware (i.e., F/W1 and F/W2 are illustrated in FIGS. 9 to 11) in a plurality of nonvolatile memories will be described.

FIG. 9 is a schematic diagram for describing an operation to pre-program memory cells so as to have a level of a threshold voltage greater than a level of a reference voltage. Referring to FIG. 9, the controller 1210 may perform a pre-program operation Pre_pgm in response to the pre-program request RQ_pre from a host. For descriptive convenience, it is assumed that a size of firmware does not exceed capacity of one nonvolatile memory.

The firmware F/W1 may be pre-programmed in the nonvolatile memory NVM1. Here, memory cells in the nonvolatile memory NVM1 may be programmed using the first verification voltage Vvfy1 greater than the first reference voltage Vref1. For example, a level of the first reference voltage Vvfy1 may be set in view of a change in a threshold voltage distribution according to an SMT process, by a memory vendor.

Moreover, the firmware F/W2 which is the same as the firmware F/W1 may be pre-programmed in a nonvolatile memory NVM2. In this case, memory cells in the nonvolatile memory NVM2 may be programmed using a second verification voltage Vvfy2 greater than the first reference voltage Vvfy1. For example, a level of the second reference voltage Vvfy2 may be determined in view of a change in a threshold voltage distribution according to an SMT process, by a memory vendor.

FIG. 10 is a schematic diagram for describing that a threshold voltage distribution of the nonvolatile memory moves after an SMT process. As described above, when a process, in which a heat is generated, such as an SMT process, an IR reflow, and the like is performed, a threshold voltage distribution of the memory cells may be changed.

For example, a threshold voltage of memory cells in the nonvolatile memory NVM1 may be changed so as to have a threshold voltage greater than or equal to a first verification voltage Vvfy1'. In this case, the first verification voltage Vvfy1' may be smaller than or greater than the first reference voltage Vref1' based on a time of an SMT process, a generated heat, and the like. In contrast, when the first verification voltage Vvfy1' is equal to the first reference voltage Vref1, this may be a desired case. A threshold voltage of memory cells in the nonvolatile memory NVM2 may be changed so as to have a threshold voltage greater than or equal to a first verification voltage Vvfy2'. The second verification voltage Vvfy2' may be smaller than or greater than the first reference voltage Vref1 or may be equal to the first reference voltage Vref1. However, the second verification voltage Vvfy2' may be generally greater than the first verification voltage Vvfy1'.

FIG. 11 is a block diagram for describing re-programming to adjust a changed threshold voltage distribution after an SMT process.

The controller 1210 may perform a re-program operation based on the re-program request RQ_repgm from a host. Alternatively, when a specific trigger condition (e.g., a power-on reset) is satisfied, the controller 1210 may automatically perform a re-program operation. Memory cells of pre-programmed nonvolatile memories NVM1 and NVM2 may be respectively re-programmed using a first reference voltage Vref1 and a second reference voltage Vref2 based on the re-program command Re_pgm from the controller 1210.

When performing a re-program operation, the controller 1210 may perform a verification operation with respect to memory cells of the pre-programmed nonvolatile memory NVM1. As a result of a verification operation, if a program operation is passed (i.e., when a read error of which correction is impossible using ECC or a boot fail does not occur), the controller 1210 may re-program the memory cells of the nonvolatile memory NVM1 using the first reference voltage Vref1.

Moreover, the controller 1210 may copy firmware F/W1, which is programmed at the nonvolatile memory NVM1, to the nonvolatile memory NVM2. Programming the same firmware in a plurality of nonvolatile memories may be to prepare the case that an uncorrectable error occurs in a nonvolatile memory.

However, as a result of a verification operation, if a program operation is failed (i.e., an uncorrectable read error using ECC or a boot fail occurs), the controller 1210 may re-program the memory cells of the nonvolatile memory NVM2 using the first reference voltage Vref1. As a result of a verification operation, if a program operation is passed, the controller 1210 may re-program the memory cells of the nonvolatile memory NVM2 using the second reference voltage Vref2.

Moreover, the controller 1210 may copy firmware F/W2, which is programmed at the nonvolatile memory NVM2, to the nonvolatile memory NVM1. Likewise, this may be to prepare the case that an uncorrectable error occurs, later.

Figure 12:
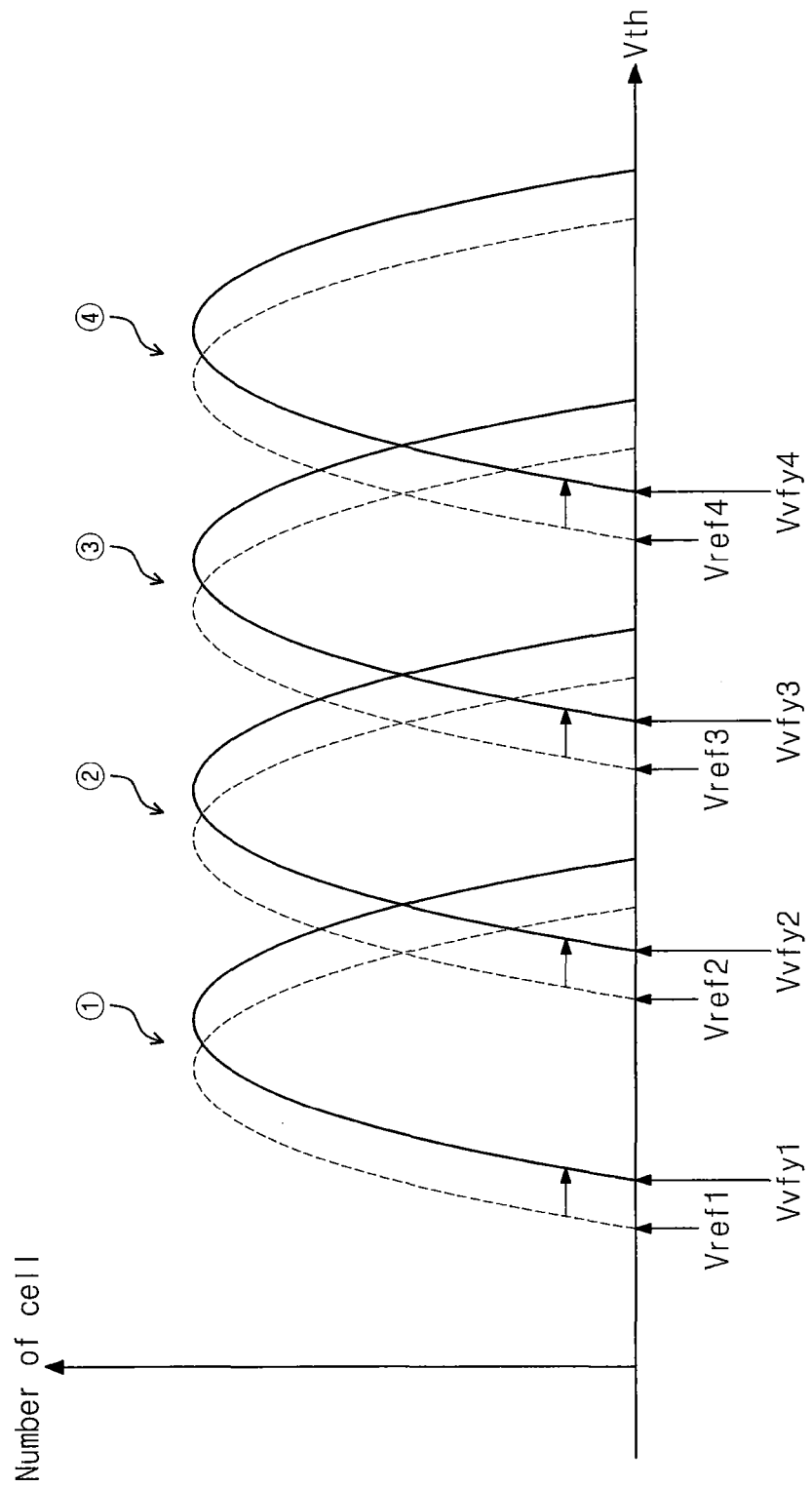
FIG. 12 illustrates a change in a threshold voltage distribution of the memory cells based on a pre-program operation and a re-program operation with reference to some embodiments described in FIGS. 9 to 11.

FIG. 12 illustrates a change in a threshold voltage distribution of the memory cells according to a pre-program operation and a re-program operation with reference to some embodiments described in FIGS. 9 to 11. Above, in FIGS. 9 to 11, a pre-program operation and a re-program operation about or with respect to two nonvolatile memories NVM1 and NVM2 are described. As another example, a pre-program operation and a re-program operation which are performed with respect to four nonvolatile memories will be described in FIG. 12.

Referring to FIG. 12, a change of a threshold voltage distribution indicated by ① may illustrate a change in a threshold voltage distribution of the memory cells in the nonvolatile memory NVM1. A dotted line indicated by ① may be a threshold voltage distribution, which is a target of a memory vendor, about or with respect to memory cells having a threshold voltage greater than or equal to the reference voltage Vref1. A solid line indicated by ① may illustrate a threshold voltage distribution of the memory cells in the nonvolatile memory NVM1 after a pre-program operation, in view of a change in a threshold voltage distribution according to an SMT process.

A change of a threshold voltage distribution indicated by ② may illustrate a change in a threshold voltage distribution of the memory cells in the nonvolatile memory NVM2. A dotted line indicated by ② may be a threshold voltage distribution, which is a target of a memory vendor, about or with respect to memory cells having a threshold voltage greater than or equal to the reference voltage Vref2. A solid line indicated by ② may illustrate a threshold voltage distribution of the memory cells in the nonvolatile memory NVM2 after a pre-program operation, in view of a change in a threshold voltage distribution according to an SMT process.

A change of a threshold voltage distribution indicated by ③ may illustrate a change in a threshold voltage distribution of the memory cells in a nonvolatile memory NVM3. A dotted line indicated by ③ may be a threshold voltage distribution, which is a target of a memory vendor, about or with respect to memory cells having a threshold voltage greater than or equal to the reference voltage Vref3. A solid line indicated by ③ may illustrate a threshold voltage distribution of the memory cells in the nonvolatile memory NVM3 after a pre-program operation, in view of a change in a threshold voltage distribution according to an SMT process.

A change of a threshold voltage distribution indicated by ④ may illustrate a change in a threshold voltage distribution of the memory cells in a nonvolatile memory NVM4. A dotted line indicated by ④ may be a threshold voltage distribution, which is a target of a memory vendor, about or with respect to memory cells having a threshold voltage greater than or equal to the reference voltage Vref4. A solid line indicated by ④ may illustrate a threshold voltage distribution of the memory cells in the nonvolatile memory NVM4 after a pre-program operation, in view of a change in a threshold voltage distribution according to an SMT process.

When an SMT process is performed after the controller 1210 and the pre-programmed nonvolatile memories 1220 are delivered by a memory vendor, a threshold voltage distribution of each of the nonvolatile memories 1220 may be changed from a solid line to a dotted line. However, this may be an ideal case, and in fact, a possibility that a threshold voltage distribution is not consistent with a dotted line may be high. Accordingly, there may be a need for an additional re-program operation. Below, it is assumed that a threshold voltage distribution after an SMT process is not consistent with a dotted line.

The controller 1210 may perform a verification operation with respect to the nonvolatile memory NVM1. When verification is successful, the controller 1210 may perform a re-program operation with respect to the nonvolatile memory NVM1 such that memory cells of the nonvolatile memory NVM1 have a dotted-lined threshold voltage distribution indicated by ①. Moreover, the controller 1210 may copy firmware, which is programmed at the nonvolatile memory NVM1, in the nonvolatile memories NVM2 to NVM4.

However, when verification with respect to memory cells in the nonvolatile memory NVM1 is failed, the controller 1210 may perform a verification operation with respect to memory cells in the nonvolatile memory NVM2. If verification is successful, the controller 1210 may perform a re-program operation with respect to the nonvolatile memory NVM2 such that memory cells of the nonvolatile memory NVM2 have a dotted-lined threshold voltage distribution indicated by ②. Moreover, the controller 1210 may copy firmware, which is programmed at the nonvolatile memory NVM2, in the nonvolatile memories NVM1, NVM3, and NVM4.

However, when verification about or with respect to memory cells in the nonvolatile memory NVM2 is failed, the controller 1210 may perform a verification operation with respect to memory cells in the nonvolatile memory NVM3. If verification is successful, the controller 1210 may perform a re-program operation with respect to the nonvolatile memory NVM3 such that memory cells of the nonvolatile memory NVM3 have a dotted-lined threshold voltage distribution indicated by ③. Moreover, the controller 1210 may copy firmware, which is programmed at the nonvolatile memory NVM3, in the nonvolatile memories NVM1, NVM2, and NVM4.

However, when verification about or with respect to memory cells in the nonvolatile memory NVM3 is failed, the controller 1210 may perform a verification operation with respect to memory cells in the nonvolatile memory NVM4. If verification is successful, the controller 1210 may perform a re-program operation with respect to the nonvolatile memory NVM4 such that memory cells of the nonvolatile memory NVM4 have a dotted-lined threshold voltage distribution indicated by ④. Moreover, the controller 1210 may copy firmware, which is programmed at the nonvolatile memory NVM4, in the nonvolatile memories NVM1 to NVM3.

Reliability of the nonvolatile memories may be improved by pre-programming and re-programming the same firmware in a plurality of nonvolatile memories using methods as described herein. In particular, in an on-board SSD which is directly or otherwise mounted on a board (e.g., printed circuit board) after the controller 1210 and the nonvolatile memories 1220 are produced and delivered by a memory vendor, reliability of data storage may be improved by reducing or preventing a boot fail generated by a change in a threshold voltage distribution due to an SMT process.

Figure 13:
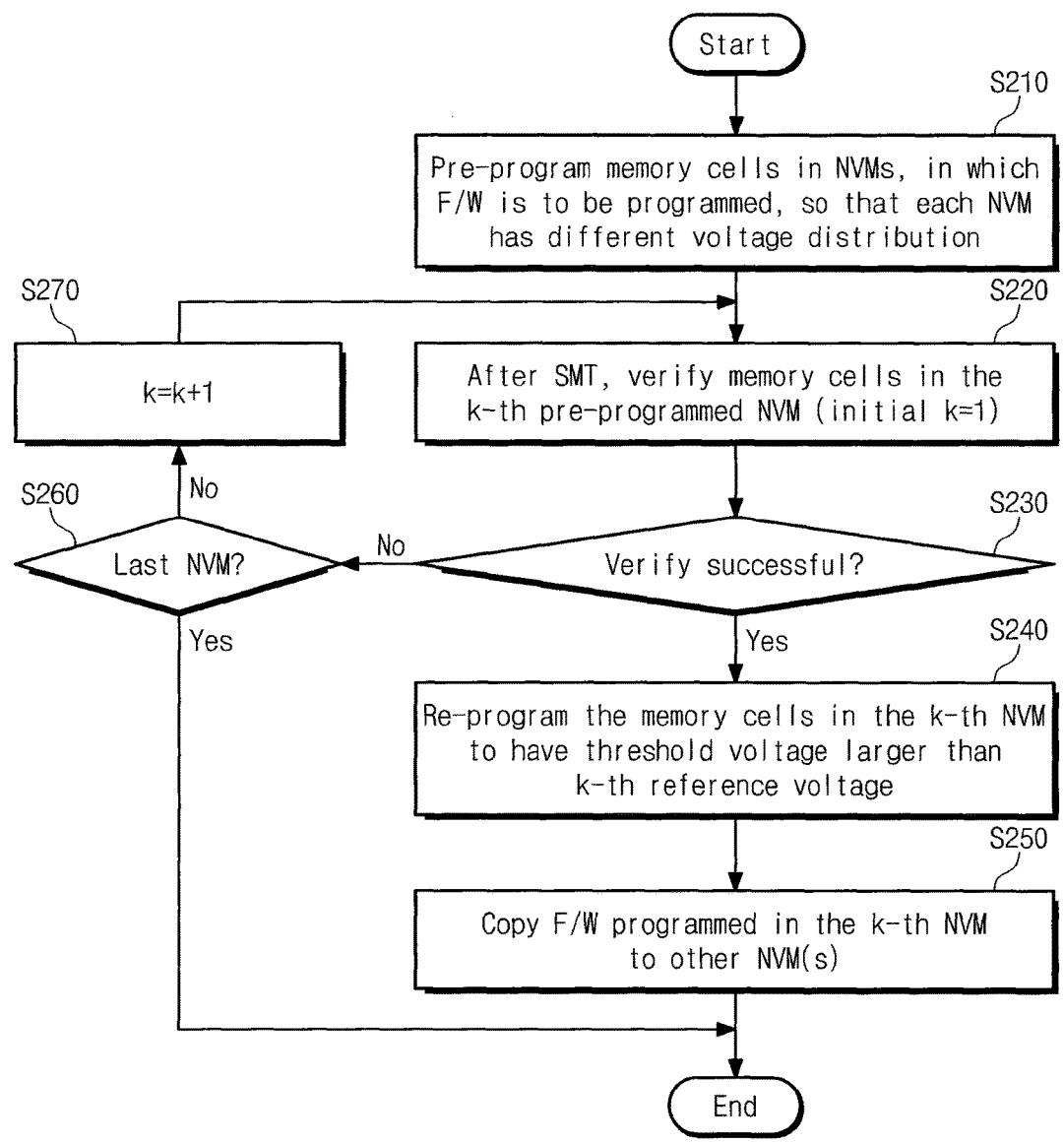
FIG. 13 is a flowchart illustrating an operating method of data storage according to some embodiments of the inventive concepts.

FIG. 13 is a flowchart illustrating an operating method of data storage according to some embodiments of the inventive concepts. An operating method of data storage will be described with reference to FIGS. 7 and 9 to 12.

In step S210, memory cells of a nonvolatile memory in which firmware is programmed may be pre-programmed. For example, a pre-program operation may refer to an operation to program memory cells using the verification voltage Vvfy greater than the reference voltage Vref. For example, the first nonvolatile memory NVM1 may be programmed using the first verification voltage Vvfy1 greater than the first reference voltage Vref1. The second nonvolatile memory NVM2 may be programmed using the second verification voltage Vvfy2 greater than the second reference voltage Vref2. Moreover, the k-th nonvolatile memory NVMk may be programmed using a k-th verification voltage Vvfyk greater than a k-th reference voltage Vrefk. In the case, 'k' may be smaller than 'n' which is the number of total nonvolatile memories, because firmware is programmed at 'k' nonvolatile memories which is a portion of 'n' nonvolatile memories.

In step S220, after an SMT process is performed with respect to the controller 1210 and the nonvolatile memories 1220, a verification operation may be performed. The verification operation may sequentially start from the first nonvolatile memory NVM1 (k of an initial value is '1').

In step S230, whether the verification operation about or with respect to a nonvolatile memory is successful may be determined. If the verification operation is determined as being successful (i.e., Yes), the procedure may proceed to step S240; Otherwise (i.e., No), the procedure may proceed to step S260.

In step S240, a re-program operation about or with respect to a nonvolatile memory in which the verification operation is determined as being successful may be performed. The re-program operation may be performed such that each of memory cells in the nonvolatile memory has a threshold voltage greater than or equal to a reference voltage corresponding to the nonvolatile memory. For example, memory cells in the k-th nonvolatile memory NVMk may be programmed using a k-th reference voltage Vrefk.

In step S250, firmware stored in the k-th nonvolatile memory NVMk which is re-programmed may be copied onto other nonvolatile memories. As such, an uncorrectable error or a boot fail which is unexpected may be reduced or prevented by storing the same firmware at a plurality of nonvolatile memories.

In step S260, whether a nonvolatile memory in which the verification is failed is a last nonvolatile memory may be determined. If the nonvolatile memory is the last nonvolatile memory (i.e., Yes), the procedure may be ended. This may indicate that all nonvolatile memories at which firmware is programmed are failed. However, if the nonvolatile memory is not the last nonvolatile memory (i.e., No), the procedure may proceed to step S270 and a verification operation about or with respect to the next nonvolatile memory may be prepared.

For example, when a re-program request is received from a host, or when a trigger condition such as a power-on reset is satisfied, a verification operation and a re-program operation described in some embodiments of the inventive concepts may be performed.

Reliability of the nonvolatile memories may be improved by pre-programming and re-programming the same firmware at a plurality of nonvolatile memories using such methods. Especially, reliability of an on-board SSD which is directly mounted on a board (e.g., printed circuit board) after the controller 1210 and the nonvolatile memories 1220 are produced and delivered by a memory vendor may be improved. Because an SMT process is performed after firmware is previously programmed, a boot fail due to a change in a threshold voltage distribution may be reduced or prevented. Accordingly, reliability of data storage may be improved.

Figure 14:
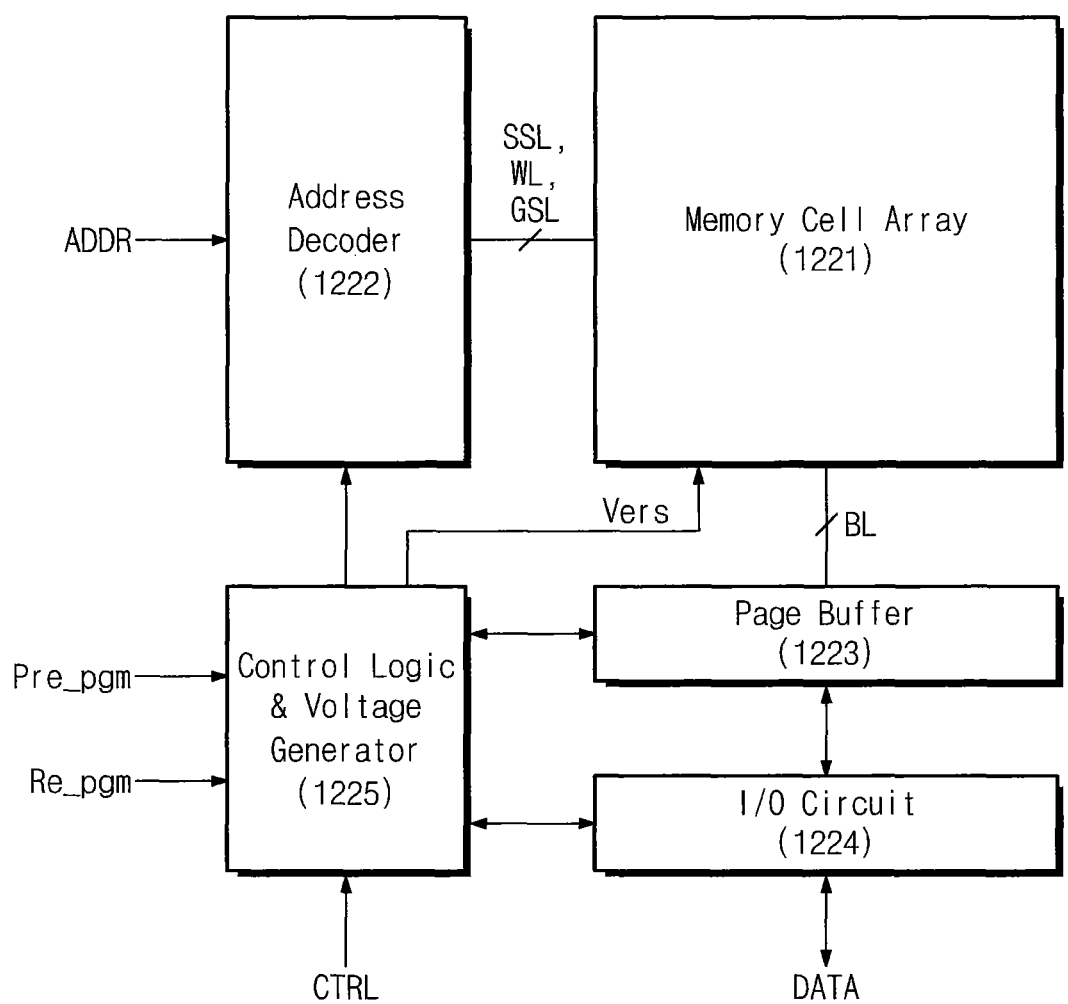
FIG. 14 is a block diagram illustrating one of nonvolatile memories according to some embodiments of the inventive concepts described FIGS. 1 to 13.

FIG. 14 is a block diagram illustrating one of nonvolatile memories described FIGS. 1 to 13. Referring to FIG. 14, a nonvolatile memory 1220 may include a memory cell array 1221, an address decoder 1222, a page buffer 1223, an input/output circuit 1224, and a control logic and voltage generator 1225.

The memory cell array 1221 may include a plurality of memory cells. Each of the memory blocks may include a plurality of cell strings. Each of the cell strings may include a plurality of memory cells. The memory cells may be connected with a plurality of word lines WL. Each memory cell may be a single level cell (SLC) storing one bit, a multi-level cell (MLC) storing at least two bits, or a triple-level cell (TLC). For example, according to some embodiments of the inventive concepts, a nonvolatile memory at which firmware is pre-programmed may be a SLC.

The address decoder 1222 may be connected with the memory cell array 1221 through the word lines WL, string selection lines SSL, and ground selection lines GSL. The address decoder 1222 may receive a physical address from an external device, may decode the received physical address, and may drive the word lines WL. For example, the address decoder 1222 may decode an address ADDR received from the external device, may select at least one of the word lines based on the decoded address ADDR, and may drive the selected word line.

The page buffer 1223 may be connected to the memory cell array 1221 through the bit lines BL. Under control of the control logic and voltage generator circuit 1225, the page buffer 1223 may control the bit lines BL such that data DATA provided from the input/output circuit 1224 is stored in the memory cell array 1221. Under control of the control logic and voltage generator circuit 1225, the page buffer 1223 may read data stored in the memory cell array 1221 and may transmit the read data to the input/output circuit 1224. For example, the page buffer 1223 may receive data from the input/output circuit 1224 by the page or may read data from the memory cell array 1221 by the page.

The input/output circuit 1224 may receive the data DATA from the external device and may transfer the received data DATA to the page buffer 1223. Alternatively, the input/output circuit 1224 may receive the data DATA from the page buffer 1223 and may transmit the received data DATA to the external device. For example, the input/output circuit 1224 may exchange the data DATA with the external device in synchronization with a control signal CTRL.

The control logic and voltage generator circuit 1225 may control the address decoder 1222, the page buffer 1223, and the input/output circuit 1224 in response to a command (e.g., Pre_pgm and Re_pgm) and the control signal CTRL from the external device. For example, the control logic and voltage generator circuit 1225 may pre-program or re-program firmware at the memory cell array 1221 in response to the signals (e.g., Pre_pgm, Re_pgm, and CMD).

The control logic and voltage generator circuit 1225 may generate various voltages to operate the nonvolatile memory 1220. For example, the control logic and voltage generator circuit 1225 may generate a plurality of program voltages, a plurality of pass voltages, a plurality of verification voltages, a plurality of selection read voltages, a plurality of non-selection read voltages, a plurality of erase voltages, and the like. The control logic and voltage generator circuit 1225 may provide the generated voltages to the address decoder 1222 or to a substrate of the memory cell array 1221.

FIG. 15 is a circuit diagram illustrating an example of one of memory blocks included in a cell array of a memory cell array in FIG. 14. In example embodiments, a memory block BLK1 having a 3-dimensional structure is described with reference to FIG. 15. Other memory blocks respectively included in the nonvolatile memories 1220 may have, but may not be limited to, a structure which is similar to the memory block BLK1.

Referring to FIG. 15, the memory block BLK1 may include a plurality of cell strings CS11, CS12, CS21, and CS22. The cell strings CS11, CS12, CS21, and CS22 may be arranged along a row direction and a column direction and may form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row.

For example, the cell strings CS11 and CS21 may be connected to a first bit line BL1 to form a first column. The cell strings CS12 and CS22 may be connected to a second bit line BL2 to form a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In some embodiments, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In some embodiments, a first dummy memory cell DMC1 may be disposed between the memory cells MC1 to MC8 and the ground selection transistors GSTa and GSTb. In some embodiments, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In some embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the ground selection line GSL, and the first ground selection transistors GSTa of the cell strings CS21 and CS22 in the second row may be connected to the ground selection line GSL.

In some embodiments, ground selection transistors provided at the same height from a substrate (not shown) may be connected to the same ground selection line, and ground selection transistors provided at different heights may be connected to different ground selection lines. For example, in the cell strings CS11, CS12, CS21, and CS22, the first ground selection transistors GSTa may be connected to the ground selection line GSL, and the second ground selection transistors GSTb may be connected to the ground selection line GSL.

Memory cells placed at the same height from the substrate (or the ground selection transistors GSTa and GSTb) may be connected in common to the same word line, and memory cells placed at different heights therefrom may be connected to different word lines. For example, the first to eighth memory cells MC1 to MC8 in cell strings CS11, CS12, CS21, and CS22 may be commonly connected the first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

String selection transistors, belonging to the same row, from among the second string selection transistors SSTb at the same height may be connected to the same string selection line, and string selection transistors belonging to different rows may be connected to different string selection lines. For example, the second string selection transistors SSTb of the cell strings CS11 and CS12 in the first row may be connected in common to the string selection line SSL1b, and the second string selection transistors SSTb of the cell strings CS21 and CS22 in the second row may be connected in common to the string selection line SSL2b.

In some embodiments, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In some embodiments, dummy memory cells at the same height may be connected with the same dummy word line, and dummy memory cells at different heights may be connected with different dummy word lines. For example, the first dummy memory cells DMC1 may be connected with the first dummy word line DWL1, and the second dummy memory cells DMC2 may be connected with the second dummy word line DWL2.

In the memory block BLK1, read and write operations may be performed by the row. For example, one row of the first memory block BLK1 may be selected by the string selection lines SSL1a, SSL1b, SSL2a, and SSL2b.

For example, the cell strings CS11 and CS12 in a first row may be connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in a second row may be connected to the bit lines BL1 and BL2 when the turn-on voltage is supplied to the string selection lines SSL2a and SSL2b and the turn-off voltage is supplied to the string selection lines SSL1a and SSL1b and may be driven. Memory cells, belonging to the same height, from among memory cells of a cell string in a row driven by operating a word line may be selected. In selected memory cells, a read and write operation may be performed. The selected memory cells may be implemented with a physical page unit.

In the memory block BLK1, memory cells may be erased by the memory block or by the sub-block. When erasing is performed by the memory block, all memory cells MC in the memory block BLK1 may be simultaneously erased according to an erase request. When erasing is performed by the sub-block, a portion of memory cells in the memory block BLK1 may be simultaneously erased according to an erase request, and the others thereof may be erase-inhibited. A low voltage (e.g., a ground voltage) may be supplied to a word line connected to erased memory cells, and a word line connected to erase-inhibited memory cells MC may be floated.

The memory block BLK1 illustrated may be an example. The number of cell strings may increase or decrease, and the number of rows of cell strings and the number of columns of cell strings may increase or decrease according to the number of cell strings. In the memory block BLK1, the number of cell transistors (e.g., GST, MC, DMC, SST, or the like) may increase or decrease, and a height of the memory block BLK1 may increase or decrease according to the number of cell transistors. Furthermore, the number of lines (e.g., GSL, WL, DWL, SSL, or the like) connected with cell transistors may increase or decrease according to the number of cell transistors.

Figure 16:
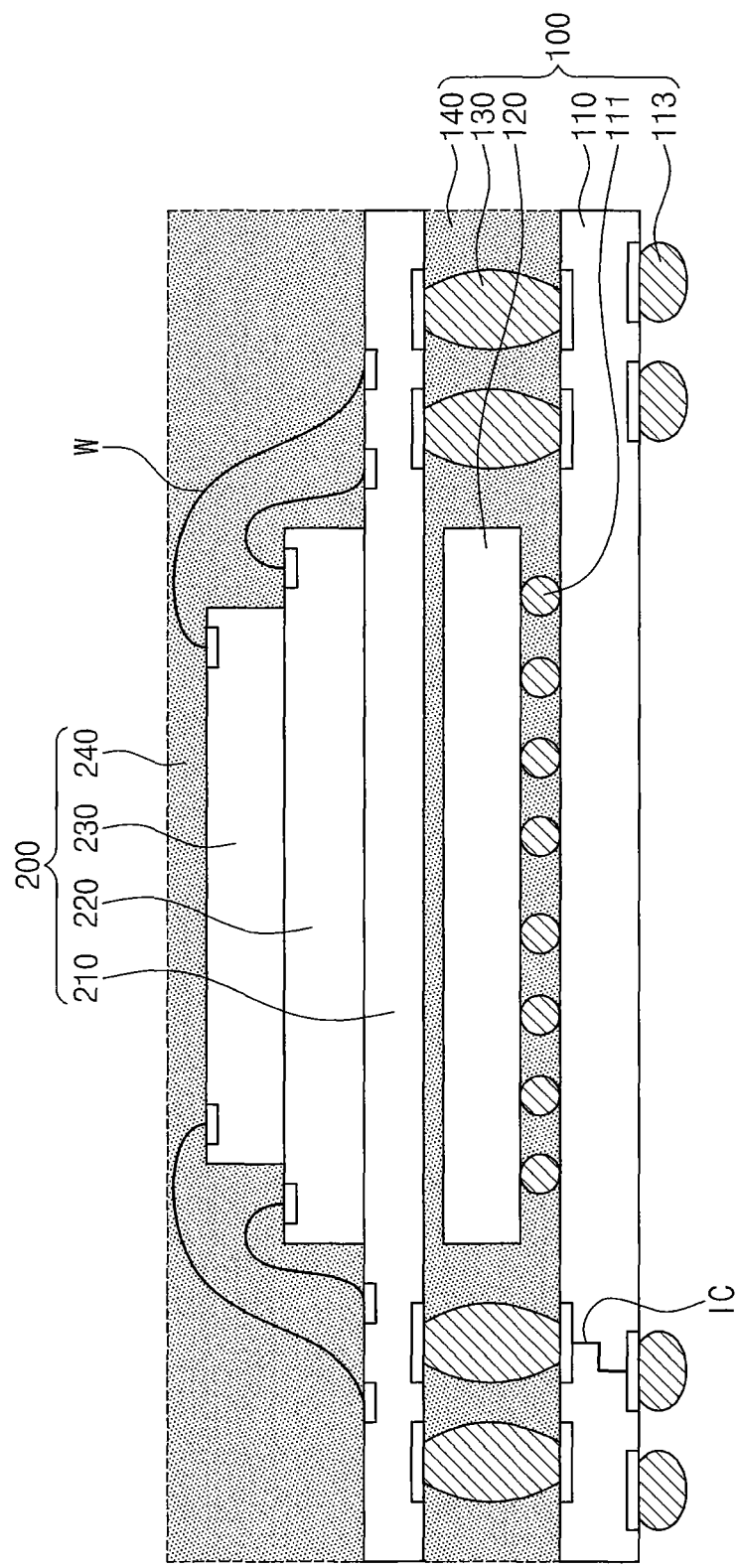
FIG. 16 is a sectional diagram of a semiconductor package according to some embodiments of the inventive concepts.

FIG. 16 is a sectional view of a semiconductor package according to some embodiments of the inventive concepts. Referring to FIG. 16, a semiconductor package may include a lower package 100 and an upper package 200.

The lower package 100 may include a lower substrate 110, connection ports 111, external ports 113, a lower semiconductor chip 120, and a lower molding layer 140. The lower package 100 may be a flip chip element, in which the lower semiconductor chip 120 is mounted on the lower substrate 110 in a face down manner.

The lower substrate 110 may be a printed circuit board (PCB) having a circuit pattern. The connection ports 111 may be interposed between the lower substrate 110 and the lower semiconductor chip 120 and may electrically connect the lower semiconductor chip 120 with the lower substrate 110. The connection ports 111 may include a conductive material and may have a form of a solder or a bump. The external ports 113 may be arranged on a bottom surface of the lower substrate 110. The external ports 113 may include a conductive material and may have a form of a solder ball. The external ports 113 may electrically connect upper semiconductor chips 220 and 230 and/or the lower semiconductor chip 120 with an external electronic device (not shown). For example, the upper semiconductor chips 220 and 230 and the external ports 113 may be connected through internal connections IC.

The lower semiconductor chip 120 may be mounted on the lower substrate 110. The lower semiconductor chip 120 may be sealed by the lower molding layer 140. For example, the lower semiconductor chip 120 may include the controller 1210 (refer to FIG. 1) which performs a pre-program and a re-program operation according to some embodiments of the inventive concepts. The lower molding layer 140 may include an insulating polymer material such as epoxy molding compound.

Connection units 130 may be provided between the lower substrate 110 and an upper substrate 210 and may electrically connect the upper package 200 with the lower substrate 110. The connection units 130 may be arranged so as to be adjacent or surround the lower semiconductor chip 120 placed on the lower substrate 110. The connection units 130 may be a form of a bump or a solder ball. For example, the connection units 130 may include a conductive material.

The upper package 200 may include the upper substrate 210, a first semiconductor chip 220, a second semiconductor chip 230, and an upper molding layer 240. Some embodiments of the inventive concepts are exemplified with respect to an upper package 220 that includes two semiconductor chips. However, the scope and spirit of the inventive concepts may not be limited thereto.

The upper substrate 210 may be a PCB having a circuit pattern. A bottom surface of the upper substrate 210 may make contact with the connection units 130 in a boundary region of the lower substrate 110.

The first upper semiconductor chip 220 may be mounted on the upper substrate 210. The second upper semiconductor chip 230 may be arranged on the first upper semiconductor chip 220 and may be electrically connected with the upper substrate 210. For example, the first upper semiconductor chip 220 and the second upper semiconductor chip 230 may be electrically connected with the upper substrate 210 through a wire bonding W. Alternatively, the first upper semiconductor chip 220 and/or the second upper semiconductor chip 230 may be mounted on the upper substrate 210 through a die bonding or a flip chip bonding. The first upper semiconductor chip 220 and the second upper semiconductor chip 230 may include an integrated circuit. For example, the first upper semiconductor chip 220 and the second upper semiconductor chip 230 may include a buffer such as a dynamic random access memory (DRAM), in which firmware is temporarily stored, during a pre-program operation and re-program operation according to some embodiments of the inventive concepts. The first upper semiconductor chip 220 and the second upper semiconductor chip 230 may be sealed by the upper molding layer 240.

Some embodiments of the inventive concepts may be applied to on-board type data storage.

Figure 17:
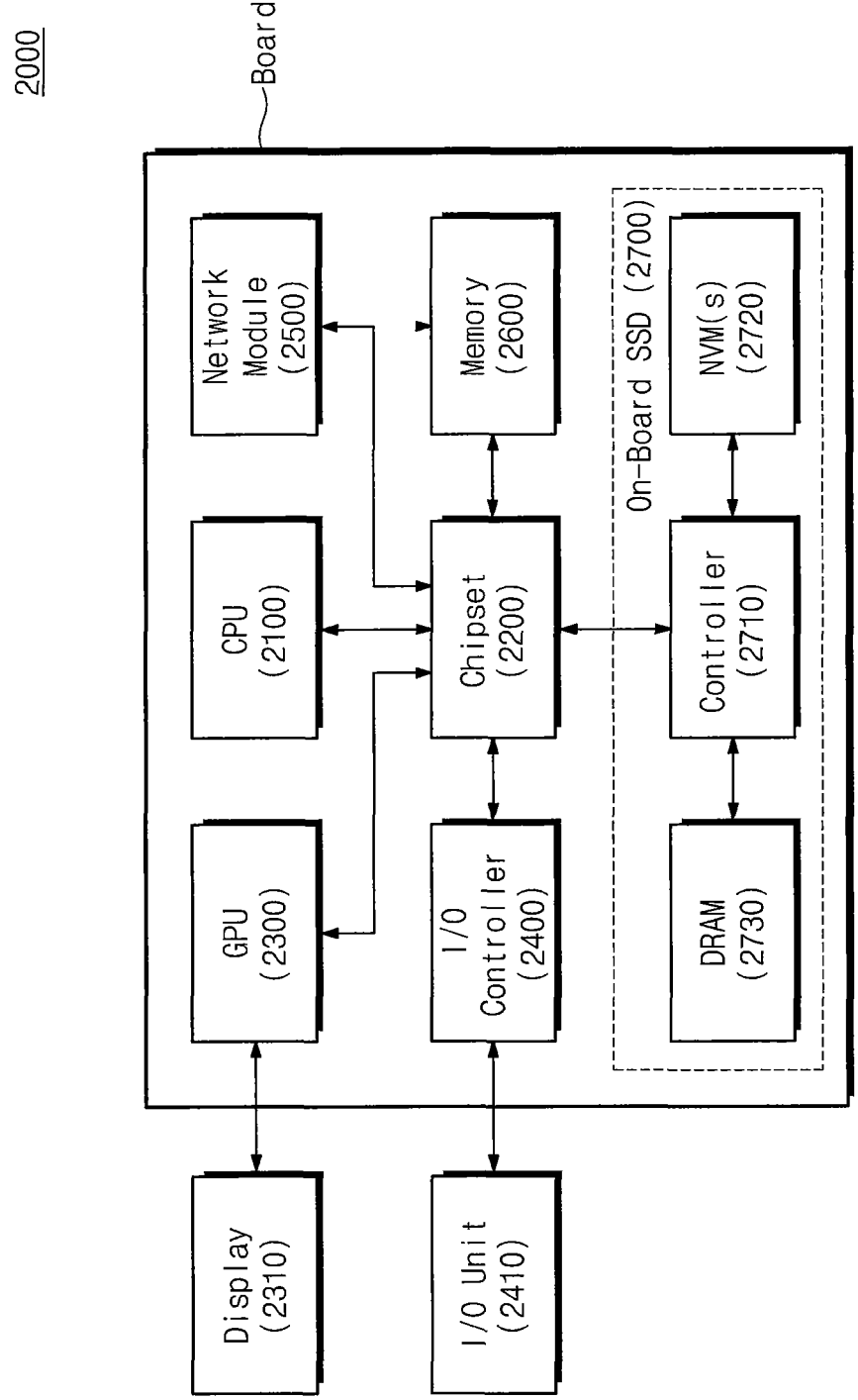
FIG. 17 is a block diagram illustrating a computing system to which data storage is applied, according to some embodiments of the inventive concepts.

FIG. 17 is a block diagram illustrating a computing system to which data storage is applied, according to some embodiments of the inventive concepts. For example, a computing system 2000 may include at least one of various electronic devices which are equipped with a side-band interface such as a desktop, a laptop, an ultra-mobile PC (UMPC), a net-book, a tablet, a smartphone, or the like.

Referring to FIG. 17, the computing system 2000 may include a central processing unit (CPU) 2100, a chipset 2200, a graphic processing unit (GPU) 2300, a display 2310, an input/output (I/O) controller 2400, an I/O unit 2410, a network module 2500, a memory 2600, and an on-board SSD 2700. The on-board SSD 2700 may refer to data storage in which a controller 2710, a nonvolatile memory 2720, a DRAM 2730, and the like, which constitute the data storage, are directly or otherwise mounted on a board.

The CPU 2100, the chipset 2200, the GPU 2300, the I/O controller 2400, the network module 2500, the memory 2600, the controller 2710, and a nonvolatile memory 2720 may be provided on a board. For example, the board may include at least one of various types of substrates such as a PCB, a flexible board, and a tape board. The board may be formed of a flexible printed circuit board, a rigid printed circuit board, or a combination thereof in which internal wires are formed therein.

The CPU 2100 may operate an operating system OS or an application program for operating the computing system 2000.

The chipset 2200 may control various components, which are included in the computing system 2000, under control of the CPU 2100. For example, the chipset 2200 may control an overall operation of each of the GPU 2300, the I/O controller 2400, the network module 2500, the memory 2600, and the on-board SSD 2700.

The GPU 2300 may process graphic data and may transmit the processed graphic data to the display 2310. The display 2310 may display the graphic data processed by the GPU 2300. A panel of the display 2310 may be various panels such as a liquid crystal display panel (LCD), an electrophoretic display panel, an electro-wetting display panel, a plasma display panel (PDP), an organic light-emitting diodes (OLED).

The I/O controller 2400 may process information input to the computing system 2000 by the I/O unit 2410. For example, the I/O unit 2410 may be connected with the I/O controller 2400 through a personal system 2 (PS2) port, a peripheral component interconnection (PCI) slot, a dual in-line memory module (DIMM) slot, an universal serial bus (USB) port, a red, green, blue (RGB) port, a digital video interactive (DVI) port, a high definition multimedia interface (HDMI) port.

The network module 2500 may provide an interface between the computing system 2000 and an external system or a network. For example, the network module 2500 may operate based on a protocol such as a wireless-fidelity (Wi-Fi), a Bluetooth, a wireless metropolitan area network (MAN), a long term evolution advanced (LTE-A), an enhanced data rates for global system for mobile communications (GSM) evolution, a evolved high-speed packet access (HSPA+), an Ethernet, a Fibre channel, a power line communication.

The memory 2600 may be used as a working memory of the computing system 2000. At booting, an OS, an application, and the like which are read from the on-board SSD 2700 may be loaded to the memory 2600. For example, the memory 2600 may be implemented with a memory module. In this case, the memory module may include a volatile random access memory, such as DRAM, SDRAM, double date rate DRAM (DDR SDRAM), DDR2 SDRAM, DDR3 SDRAM, LPDDR DRAM, LPDDR2 DRAM, or LPDDR3 DRAM or a nonvolatile random access memory such as a PRAM, an MRAM, an RRAM, or an FRAM.

The on-board SSD 2700 may include the controller 2710, the nonvolatile memories 2720, and the DRAM 2730. For example, the controller 2710 and the DRAM 2730 may be packaged, as described in FIG. 16. Moreover, the nonvolatile memory 2720 may be packaged in the form of a multi stack chip. After the controller 2710 and the nonvolatile memory 2720 are pre-programmed by a memory vendor, the controller 2710 and the nonvolatile memory 2720 may be delivered to a fabricator. Afterwards, the controller 2710, the nonvolatile memory 2720, and the DRAM 2730, and the like which are components of the on-board SSD 2700 may be mounted on a board by an SMT process, and a threshold voltage distribution of a memory cell in the nonvolatile memory 2720 may be changed during an SMT process. However, in the pre-programmed nonvolatile memory according to some embodiments of the inventive concepts, an error or a boot fail due to a change in a threshold voltage distribution may be reduced or prevented.

Figure 18:
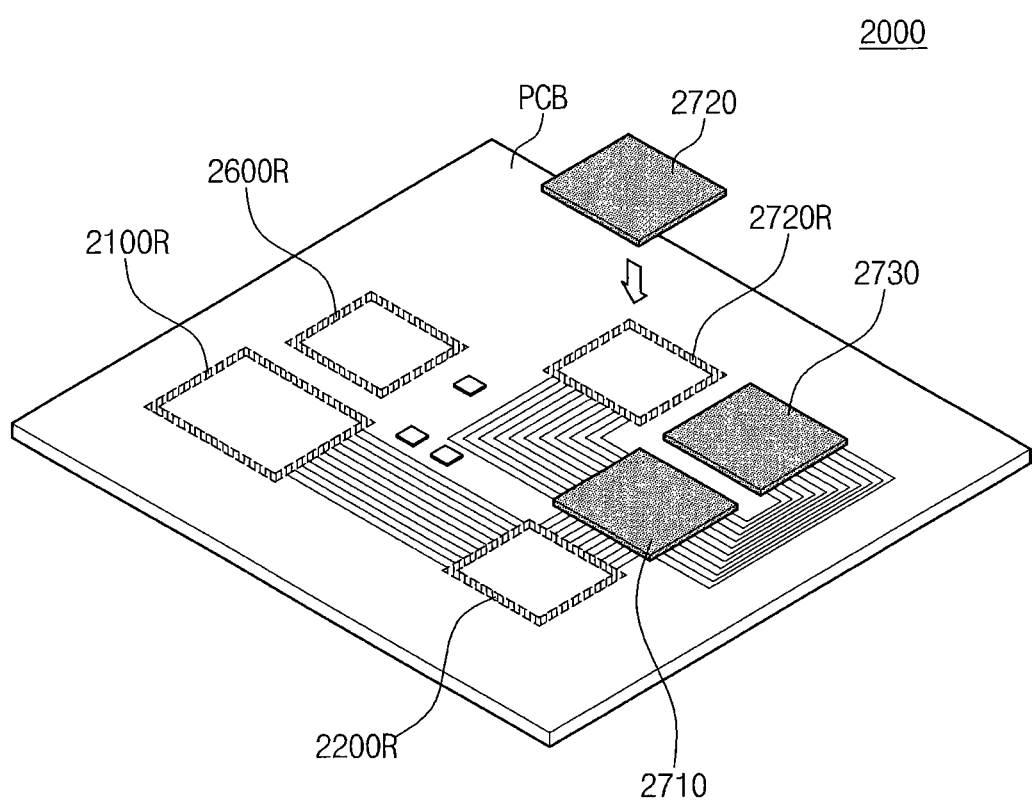
FIG. 18 is a diagram illustrating a board of FIG. 17.

FIG. 18 is a diagram illustrating a board of FIG. 17. For descriptive convenience, a portion of components among components included in the computing system 2000 may be omitted.

Referring to FIGS. 17 and 18, as described above, a board may include dedicated regions in which various components included in the computing system 2000 are mounted. For example, the board may include a dedicated region 2100R on which the CPU 2100 is mounted, a dedicated region 2200R on which the chipset 2200 is mounted, a dedicated region 2600R on which the memory 2600 is mounted, a dedicated region 2720R on which the nonvolatile memory 2720 is mounted, and the like. Each of the dedicated regions may be electrically connected with each other through wires provided on a board. The controller 2710 and the DRAM 2730 are respectively mounted on the dedicated regions included in the board may be exemplified.

Each of the controller 2710, the nonvolatile memory 2720, and the DRAM 2730 may be mounted on the board using an SMT process. For example, the nonvolatile memory 2720 may be mounted on the dedicated region 2720R on the board. For example, the controller 2710, the nonvolatile memory 2720, the DRAM 2730, or a combination thereof may be mounted on the board to be implemented with a separate chip or a separate package. For example, the controller 2710 and the DRAM 2730 may be mounted in the form which is packaged as described in FIG. 16.

Some embodiments of the inventive concepts may be applied to an embedded multimedia card (eMMC).

Figure 19:
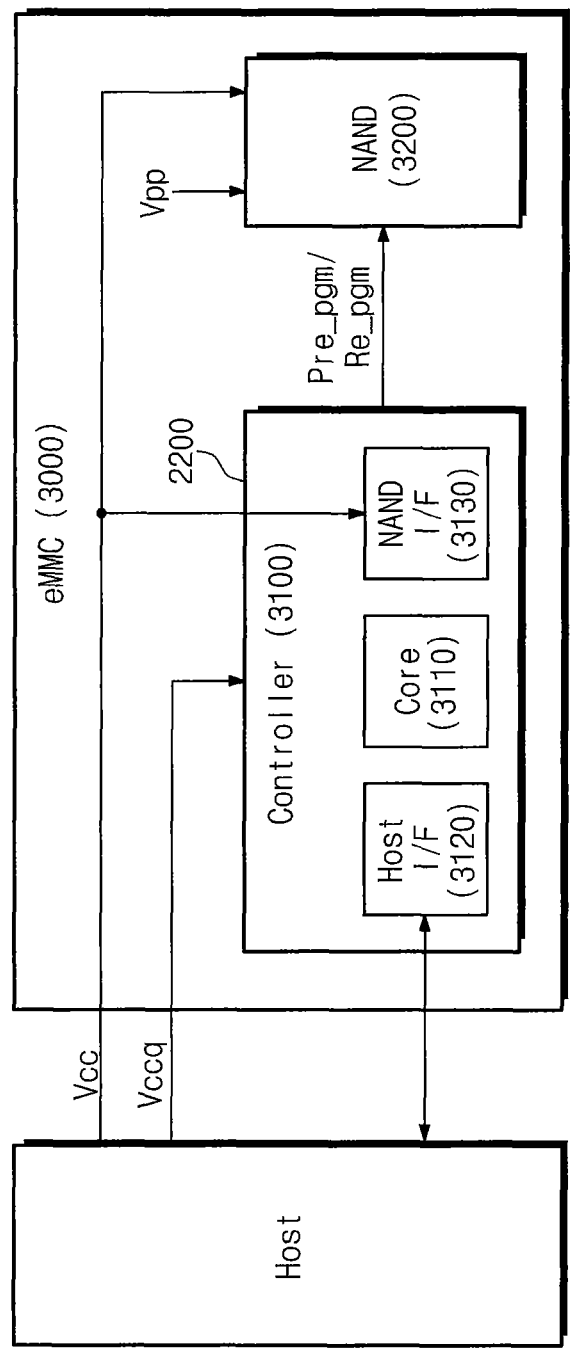
FIG. 19 is a block diagram illustrating an eMMC according to some embodiments of the inventive concepts.

FIG. 19 is a block diagram illustrating an eMMC according to some embodiments of the inventive concepts. Referring to FIG. 19, an eMMC 3000 may include a controller 3100 and at least one NAND flash memory device 3200.

The controller 3100 may be connected with the NAND flash memory device 3200 though a channel. The controller 3100 may include at least one core 3110, a host interface 3120, and the NAND interface 3130. The core 3110 may control an overall operation of the eMMC 3000. The host interface 3120 may provide an interface with the controller 3100. The NAND interface 3130 may provide an interface between the NAND flash memory device 3200 and the controller 3100. For example, the host interface 3120 may be a parallel interface (e.g., MMC interface). For example, the host interface 3120 in the eMMC 3000 may be a serial interface (e.g., UHS-II, UFS interface). For example, the host interface 3120 may be a NAND interface.

The eMMC 3000 may receive power supply voltages Vcc and Vccq from a host. Here, the first power voltage Vcc (e.g., 3.3 V) may be provided to the NAND flash memory device 3200 and the NAND interface 3130, and the second power voltage Vccq (e.g., 1.8 V/3.3 V) may be provided to the controller 3100. For example, eMMC 3000 may optionally receive an external high-voltage Vppx.

A boot fail may be reduced or prevented by pre-programming a nonvolatile memory before applying a surface mounting technology.

Those of ordinary skill in the art will recognize that various changes and modifications of the embodiments described herein can be made without departing from the scope and spirit of the inventive concepts. Modifications and variations of the present inventive concepts are included within the scope of the following claims and equivalents.

What is claimed is:

1. A method of programming firmware to a data storage device comprising a plurality of nonvolatile memories and a controller configured to control the nonvolatile memories, the method comprising:
    before a surface mounting technology is applied to the nonvolatile memories, pre-programming first memory cells included in a first nonvolatile memory of the nonvolatile memories so as to have a threshold voltage greater than or equal to a first verification voltage which is higher than a first reference voltage; and
    pre-programming second memory cells included in a second nonvolatile memory of the nonvolatile memories so as to have a threshold voltage greater than or equal to a second verification voltage which is higher than a second reference voltage,
    wherein the second reference voltage is greater than the first reference voltage.

2. The method of claim 1, further comprising the following after the surface mounting technology is applied:
    verifying whether the first memory cells are program-passed using the first reference voltage; and
    verifying whether the second memory cells are program-passed using the second reference voltage.

3. The method of claim 2, wherein verifying the first memory cells is performed before verifying the second memory cells.

4. The method of claim 2, further comprising:
    responsive to verifying that the first memory cells are program-passed, re-programming the first memory cells such that the threshold voltage thereof is greater than or equal to the first reference voltage.

5. The method of claim 4, wherein re-programming the first memory cells is performed with respect to memory cells, of which threshold voltages are lower than the first reference voltage, from among the first memory cells.

6. The method of claim 4, wherein re-programming the first memory cells is performed using a power-on reset as a trigger condition.

7. The method of claim 4, further comprising:
    programming the firmware, which is re-programmed on the first memory cells, on the second memory cells,
    wherein the second memory cells are programmed to have the threshold voltage thereof greater than or equal to the first reference voltage.

8. The method of claim 2, further comprising:
    responsive to determining that the first memory cells are program-failed, determining whether the second memory cells of the second nonvolatile memory have been verified.

9. The method of claim 8, further comprising:
    responsive to determining that the second memory cells of the second nonvolatile memory have not been verified, verifying whether the second memory cells are program-passed.

10. The method of claim 9, further comprising:
    responsive to verifying that the second memory cells are program-passed, re-programming the second memory cells so as to have the threshold voltage thereof greater than or equal to the second reference voltage.

11. The method of claim 10, further comprising:
    programming the firmware, which is re-programmed on the second memory cells, on the first memory cells,
    wherein the first memory cells are programmed to have the threshold voltage thereof greater than or equal to the second reference voltage.

12. The method of claim 1, wherein the first and second reference voltages and the first and second verification voltages are set in view of a change in a threshold voltage distribution according to application of the surface mounting technology.

13. The method of claim 1, wherein the data storage is an on-board type storage in which the nonvolatile memories and the controller are mounted on a board.

14. The method of claim 1, wherein each of the nonvolatile memories comprises a plurality of cell strings connected to a bit line, each of the cell strings comprises a plurality of memory cells serially connected to one another, and the plurality of memory cells are connected to a plurality of word lines, respectively.

15. A method of programming firmware to a data storage device comprising a plurality of nonvolatile memories and a controller configured to control the nonvolatile memories, the method comprising:
    before a surface mounting technology is applied to the nonvolatile memories, pre-programming memory cells included in at least one nonvolatile memory of the nonvolatile memories so as to have a threshold voltage greater than or equal to a verification voltage which is higher than a reference voltage,
    wherein the reference voltage and the verification voltage are set in view of a change in a threshold voltage distribution according to an application of the surface mounting technology.

16. A method of programming a data storage device, the method comprising:
    before mounting a nonvolatile memory of the data storage device to a board, performing, by a controller, operations comprising:
    receiving a pre-program request for memory cells of the nonvolatile memory; and
    pre-programming the memory cells of the nonvolatile memory to alter respective threshold voltages thereof to a verification voltage that is greater than a reference voltage, responsive to the pre-program request,
    wherein the verification voltage is based on an expected change in threshold voltage distribution of the memory cells due to an application of heat to the nonvolatile memory during the mounting, and wherein the memory cells of the nonvolatile memory comprise computer readable program code stored therein to control the data storage device.

17. The method of claim 16, further comprising:
after the mounting of the nonvolatile memory to the board, performing, by the controller, operations comprising:
re-programming the memory cells of the nonvolatile memory to alter the respective threshold voltages thereof to a voltage greater than or equal to the reference voltage.

18. The method of claim 17, wherein the respective threshold voltages are reduced responsive to the application of the heat during the mounting, and wherein the re-programming comprises:
verifying operation of the memory cells after the mounting of the nonvolatile memory to the board; and
re-programming the memory cells of the nonvolatile memory responsive to the verifying.

19. The method of claim 18, wherein the nonvolatile memory comprises a first nonvolatile memory of the data storage device, wherein the computer readable program code comprises firmware, and further comprising:
performing, by the controller, operations as follows responsive to failure of a verification operation for memory cells of a second nonvolatile memory of the data storage device after mounting the second nonvolatile memory to the board:
copying the firmware stored in the memory cells of the first nonvolatile memory to the memory cells of the second nonvolatile memory.

20. The method of claim 19, wherein the verification voltage comprises a first verification voltage and the reference voltage comprises a first reference voltage, wherein the pre-programming further comprises operations as follows before the mounting of the second nonvolatile memory to the board:
pre-programming the memory cells of the second nonvolatile memory to alter respective threshold voltages thereof to a second verification voltage that is greater than a second reference voltage and is different than the first verification voltage,
wherein, responsive to the failure of the verification operation for the memory cells of the second nonvolatile memory, the re-programming further comprises:
re-programming the memory cells of the second nonvolatile memory to a voltage greater than or equal to the first reference voltage.

* * * * *